(12) United States Patent
Karippumannil Prasad et al.

(10) Patent No.: US 11,169,213 B2
(45) Date of Patent: Nov. 9, 2021

(54) VOLTAGE BASED ZERO CONFIGURATION BATTERY MANAGEMENT

(71) Applicant: Texas Instruments Incorporated, Dallas, TX (US)

(72) Inventors: Githin Karippumannil Prasad, Dallas, TX (US); Yevgen Pavlovich Barsukov, Richardson, TX (US); Dale Allen Blackwell, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 548 days.

(21) Appl. No.: 15/966,284

(22) Filed: Apr. 30, 2018

(65) Prior Publication Data

US 2018/0321324 A1    Nov. 8, 2018

Related U.S. Application Data

(60) Provisional application No. 62/502,428, filed on May 5, 2017.

(51) Int. Cl.
| | | |
|---|---|---|
| *G01R 31/367* | (2019.01) | |
| *H02J 7/00* | (2006.01) | |
| *G01R 31/374* | (2019.01) | |
| *G01R 31/389* | (2019.01) | |
| *H01M 10/42* | (2006.01) | |

(52) U.S. Cl.
CPC .......... *G01R 31/367* (2019.01); *G01R 31/374* (2019.01); *G01R 31/389* (2019.01); *H01M 10/4257* (2013.01); *H02J 7/0068* (2013.01)

(58) Field of Classification Search
CPC .................................................. G01R 31/367
See application file for complete search history.

(56) References Cited

U.S. PATENT DOCUMENTS

| | | |
|---|---|---|
| 6,789,026 B2 | 9/2004 | Barsoukov et al. |
| 6,832,171 B2 | 12/2004 | Barsoukov et al. |
| 6,892,148 B2 | 5/2005 | Barsoukov et al. |
| 7,248,053 B2 | 7/2007 | Houldsworth |
| 7,259,572 B2 | 8/2007 | Houldsworth et al. |
| 7,315,489 B2 | 1/2008 | Houldsworth |
| 7,443,140 B2 | 10/2008 | Barsukov et al. |
| 7,808,244 B2 | 10/2010 | Barsukov et al. |
| 7,856,328 B2 | 12/2010 | Barsukov et al. |
| 8,049,465 B2 | 11/2011 | Barsoukov et al. |

(Continued)

OTHER PUBLICATIONS

Yevgen Barsukov, "Battery Cell Balancing: What to Balance and How," Texas Instruments, p. 2-1 through 2-8.

(Continued)

*Primary Examiner* — Lisa E Peters
(74) *Attorney, Agent, or Firm* — Mark Allen Valetti; Charles A. Brill; Frank D. Cimino

(57) ABSTRACT

Controllers and methods to manage a battery, in which a controller estimates scale factor and a steady state current rate according to multiple battery voltage values and a steady state model during steady state operation, and estimates the current rate according to a battery voltage value, the scale factor, and a dynamic model of the battery during dynamic operation, and the controller estimates a remaining capacity of the battery according to the current rate, without requiring controller reconfiguration for different batteries.

23 Claims, 13 Drawing Sheets

(56) References Cited

U.S. PATENT DOCUMENTS

| | | | |
|---|---|---|---|
| 9,130,377 B2 | 9/2015 | Barsukov et al. | |
| 9,157,968 B1* | 10/2015 | Taylor | G01R 31/392 |
| 2007/0029970 A1 | 2/2007 | Barsukov et al. | |
| 2009/0099799 A1 | 4/2009 | Barsoukov et al. | |
| 2009/0099802 A1 | 4/2009 | Barsoukov et al. | |
| 2009/0248331 A1 | 10/2009 | Barsukov | |
| 2009/0261786 A1 | 10/2009 | Hsu et al. | |
| 2009/0295397 A1 | 12/2009 | Barsukov | |
| 2010/0289457 A1 | 11/2010 | Onnerud et al. | |
| 2011/0031944 A1 | 2/2011 | Stirk et al. | |
| 2011/0089901 A1 | 4/2011 | White et al. | |
| 2011/0127963 A1 | 6/2011 | Murao et al. | |
| 2011/0234167 A1* | 9/2011 | Kao | G01R 31/3828 320/132 |
| 2011/0260687 A1 | 10/2011 | Kudo et al. | |
| 2012/0049802 A1 | 3/2012 | Barsukov et al. | |
| 2012/0074898 A1 | 3/2012 | Schwartz | |
| 2012/0091963 A1 | 4/2012 | Vance et al. | |
| 2012/0143585 A1 | 6/2012 | Barsukov et al. | |
| 2012/0194133 A1 | 8/2012 | Posamentier et al. | |
| 2013/0147434 A1 | 6/2013 | Boehm et al. | |
| 2014/0159665 A1 | 6/2014 | Boehm et al. | |
| 2014/0244193 A1* | 8/2014 | Balasingam | G01R 31/3835 702/63 |
| 2017/0184681 A1* | 6/2017 | Hariharasudhan | G01R 31/367 |

OTHER PUBLICATIONS

"Bq78z100 Impedance Track Gas Gauge for 1-Series to 2-Series Li-Ion/Li-Polymer Battery Packs" Texas Instruments, SLUSC23—Sep. 2015, 39 pages.

"2-Series, 3-Series, and 4-Series Li-Ion Battery Pack Manager" Texas Instruments, SLUSA91A—Oct. 2010—Revised Jan. 2012, 23 pages.

* cited by examiner

VOLTAGE BASED ZERO CONFIGURATION BATTERY MANAGEMENT

CROSS-REFERENCE TO RELATED APPLICATIONS

This application claims priority to, and the benefit of, U.S. Provisional Patent Application No. 62/502,428, entitled "A VOLTAGE BASED ZERO CONFIGURATION BATTERY FUEL GAUGE," filed May 5, 2017, the entirety of which is hereby incorporated by reference.

BACKGROUND

Battery management system (BMS) control power operations for battery powered devices and predict remaining capacity for one or more battery cells of a battery pack. Accurate capacity estimation relies upon battery current flow information and accurate modeling of battery parameters. This information can be obtained by direct battery current measurement in operation, and by programming the correct battery parameters such as low frequency impedance and chemical capacity. However, current sense resistors consume power, occupy circuit board space, and add cost to the battery management system. In addition, configuration or programming of battery management circuits is undesirable and costly in many applications.

SUMMARY

Described examples include controllers and methods to manage a battery, in which a controller estimates a scale factor and a steady state current rate according to multiple battery voltage values and a steady state model during steady state operation. The controller estimates the current rate according to a single battery voltage value, the scale factor, and a dynamic model of the battery during dynamic operation, and the controller estimates a remaining capacity of the battery according to the current rate.

DETAILED DESCRIPTION

Figure 1:
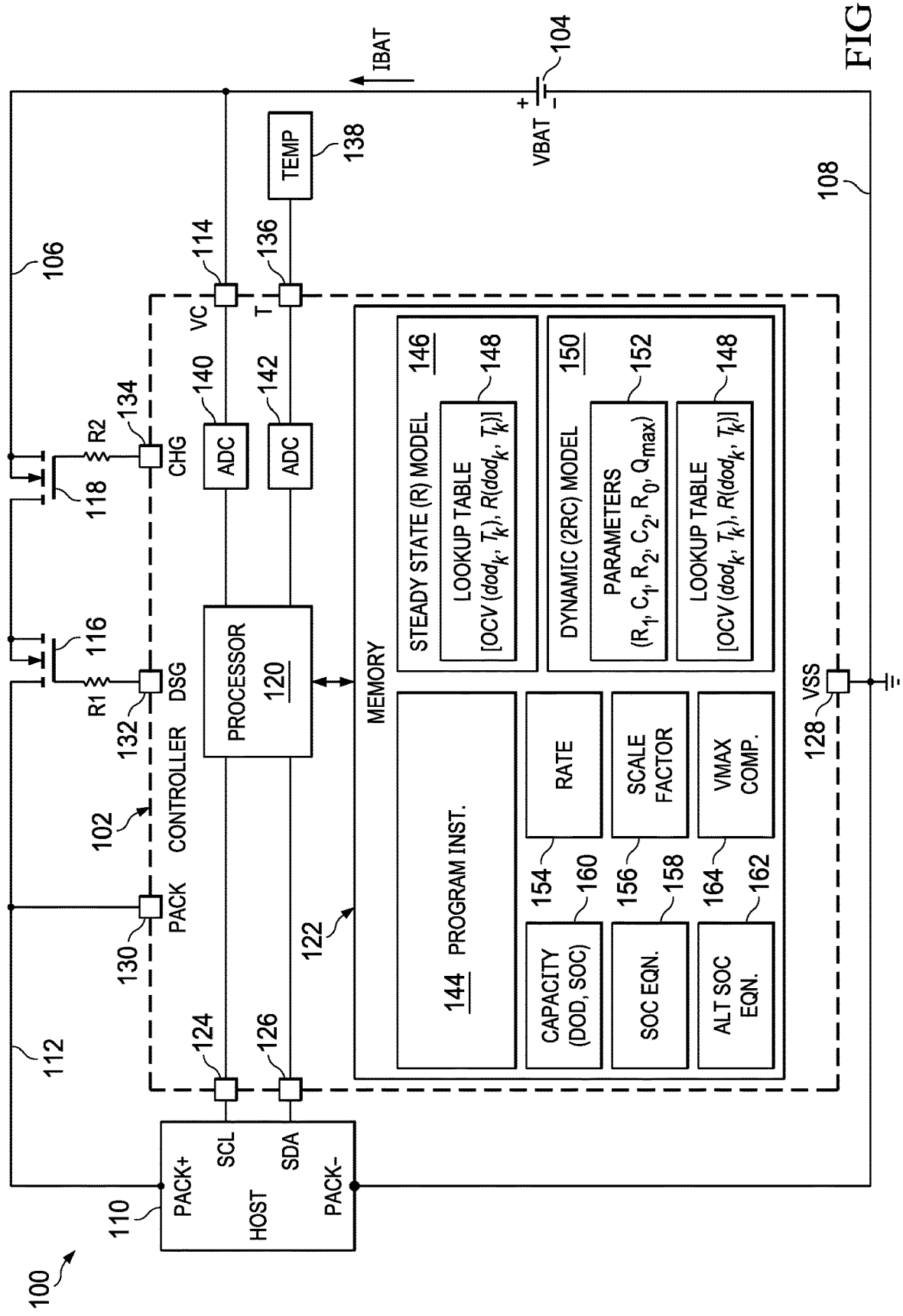
FIG. 1 is a schematic diagram of a battery management system diagram including a controller IC to manage an associated battery.

In the drawings, like reference numerals refer to like elements throughout, and the various features are not necessarily drawn to scale. In this description, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a battery management system 100, including a controller 102 to manage an associated battery 104. The associated battery can be directly or indirectly connected to the controller 102 in various implementations, such as through direct electrical connection, inductive coupling, etc. In one example, the controller 102 is an integrated circuit (IC) with terminals (e.g., pins, pads, etc.) that provide electrical connection to a positive terminal 106 and a negative terminal 108 of the associated battery 104, and to a host system or circuit 110. The host circuit 110 includes a first battery pack connection PACK+ connected to a circuit node 112 for switched connection to the positive battery terminal 106, and a second battery pack connection PACK− connected to the negative battery terminal 108. In the illustrated example, the negative battery terminal 108 provides a circuit ground or reference voltage, although not a requirement of all possible implementations. The controller IC 102 includes a first input, in this example a cell voltage sense input terminal 114 connected to the positive battery terminal 106 to receive a first signal, in this example a cell voltage signal VC that represents a battery voltage VBAT of the associated battery 104 relative to the ground or reference voltage of the negative battery terminal 108. The battery management system 100 also includes a first switch 116 (e.g., an n-channel field effect transistor or NMOS) controlled by the controller IC 102 for selective discharging of the associated battery 104. A second switch 118 (e.g., an NMOS) is connected in series with the first switch 116 between the first battery pack connection node 112 (PACK+) and the positive battery terminal 106. The second switch 118 is controlled by the controller IC 102 to facilitate charging the associated battery 104.

The controller IC 102 includes a processor 120 that operates to execute program instructions stored in a memory 122 to implement one or more battery management functions as described further below. The processor 120 in one example operates, when powered and upon retrieving and implementing instructions stored in the memory 122 to perform various computations, determinations, and other functions, for example, to estimate a current rate and a scale factor through computations, lookup table operations (e.g., including interpolation calculations) and/or other operations according to the stored instructions. The processor 120 can be any suitable digital logic circuit, programmable or preprogrammed, such as an ASIC, microprocessor, microcontroller, DSP, FPGA, etc., that operates to execute program instructions stored in the internal or external memory 122 to implement the features and functions described herein as well as other associated tasks to implement a battery management system controller. In certain examples, the memory 122 provides a non-transitory computer-readable storage medium that stores computer-executable instructions that, when executed by the processor 120, perform the various features and functions detailed herein. The controller IC 102 in this example provides a serial data communications interface to exchange data with the host circuit 110, including a terminal 124 that connects a serial clock signal (SCL) from the host to the processor 120, and a data terminal 126 that connects a bidirectional serial data line (SDA) of the host circuit 110 with the processor 120.

The controller IC 102 also includes a ground reference terminal 128 connected to the negative battery terminal 108 to receive a ground reference voltage signal VSS, as well as a battery pack connection terminal 130 connected to the first battery pack connection node 112 to receive a pack voltage signal PACK. The controller IC 102 also includes a first control output terminal 132 connected through a resistor R1 to a gate control terminal of the first switch 116 to provide a discharge control signal DSG to operate the switch 116, and a second control output terminal 134 connected through a resistor R2 to a gate control terminal of the second switch 118 in order to provide a charging control signal CHG to operate the switch 118.

The controller IC 102 also includes a second input terminal 136 connected to a thermocouple or other temperature sensor 138 positioned proximate the associated battery 104 (labeled "TEMP" in the drawing) to receive a second signal T that represents a temperature of the associated battery 104. A first analog to digital converter (ADC) 140 receives the cell voltage signal VC and provides a corresponding digital value to the processor 120. A second ADC 142 receives the temperature signal T and provides a corresponding digital value to the processor 120. In operation, the controller IC 102 estimates a remaining capacity of the associated battery 104 and provides the estimate via the communications interface 124, 126 to the host circuit 110. The controller IC 102 estimates the remaining battery capacity without directly measuring the current IBAT flowing into or out of the associated battery 104 according to (e.g., in response to or based upon) measured voltage samples of the battery voltage VBAT and samples of the battery temperature T using battery model data stored in the memory 122. The controller IC 102 operates while the associated battery 104 is in steady state operation, and during dynamic operation of the associated battery 104. As used herein, steady-state operation includes discharging operation of the associated battery 104 at a substantially constant discharging current rate after transient dynamics that follow a load change have subsided. Dynamic operation, as used herein, includes charging operation, as well as discharging of the associated battery 104 at a changing discharge current rate.

Figure 5:
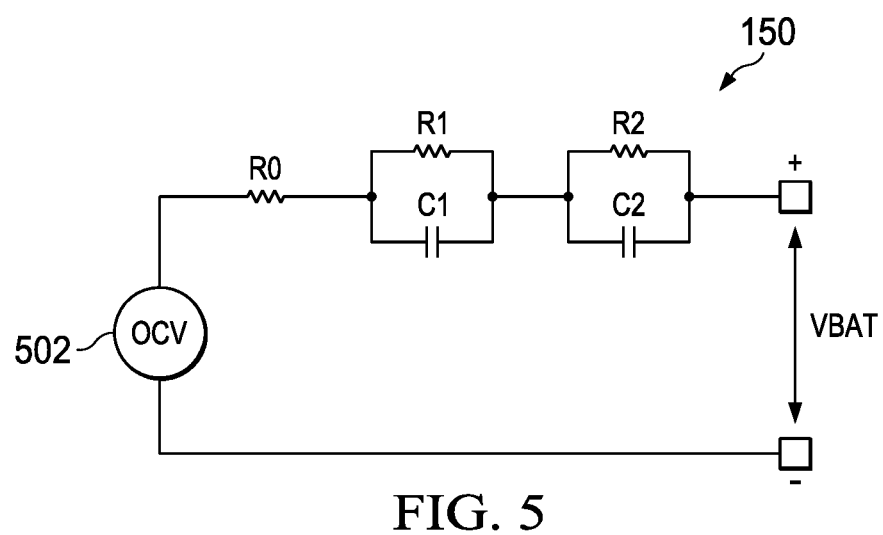
FIG. 5 is a schematic diagram of a dynamic battery model.

The memory 122 stores program instructions 144 that are executed by the processor 120. In addition, the memory 122 stores a steady state model 146 (e.g., an "R" model) of the associated battery 104. The steady state model 146 in one example includes a lookup table 148 that represents an open circuit voltage $OCV(dod_k, T_k)$ and a resistance $R(dod_k, T_k)$ of a particular battery type for different depth of discharge values $dod_k$ and for different temperatures $T_k$, where "k" is an index. The memory 122 further stores a dynamic model 150 (e.g., a 2RC model) of the particular battery type. In one example, the dynamic model 150 includes dynamic model parameters 152 (e.g., $R_1$, $C_1$, $R_2$, $C_2$, $R_0$, and $Q_{max}$, as shown in FIG. 5) that represent the particular battery type. In one example, the lookup table 148 is also used by the dynamic model 150 as schematically shown in FIG. 1. The memory 122 also stores a current rate value 154 (labeled RATE in FIG. 1), a scale factor 156 (SCALE FACTOR), and a state of charge (SOC equation 158 (SOC EQN). The processor 120 computes a remaining capacity of the associated battery 104, for example, as a remaining SOC value, or a depth of discharge (DOD) value, and stores the capacity value or values 160 in the memory 122. In addition, the memory 122 stores an alternate SOC equation 162 and a maximum voltage computation component 164 (VMAX COMP.).

The example controller IC 102 estimates a current rate 154 (e.g., the ratio of current over a maximum charge capacity ($Q_{max}$) of the battery 104). The controller IC 102 uses normalized resistance (e.g., the product of the resistance and $Q_{max}$), since resistance itself may not be sufficient to quantify the difference between two cells. One example uses normalized resistance to quantify the deviation between cells using a single scale factor 156 to account for unknown battery resistance and capacity. The use of normalized resistance and updating of the scale factor 156 facilitates one-time programming of the models 146 and 150 and the capacity 160 in the memory 122, while accommodating use of the controller IC 102 with different batteries 104. In this regard, the parameters of a particular associated battery 104 can deviate from the parameters defined by the models 146 and 150 and the capacity 160. The controller IC 102 in one example updates the scale factor 156 to accommodate variations of a particular connected batter 104 from the model parameters and over time. This operation advantageously facilitates a single programming of the memory 122 without the need to reprogram the controller IC 102 for a particular associated battery 104. In addition, the controller IC 102 adjusts the deviation in normalized resistance of the associated battery 104 using the scale factor 156 which is repeatedly updated. The example controller IC 102 accommodates deviations in a particular associated battery 104 and updates the scale factor 156 during use to accommodate deviations in a particular associated battery 104 without reprogramming of the controller memory 122.

In one example, moreover, the controller IC 102 estimates the current rate using a selected one of the models 146 or 150 according to (e.g., in response to or based upon) the current operating mode of the battery 104. In one example, the controller 102 estimates the current rate using the dynamic model 150 and the corresponding lookup table 148 during transient or dynamic mode operation of the associated battery 104, including transient conditions following a load change or during battery charging. During steady state battery operation (e.g., discharging operation), the controller IC 102 estimates the current rate using the steady state model 146 and the associated battery type parameters 152. This operation facilitates accurate battery capacity reporting by the controller IC 102 according to voltage and temperature samples, without direct measurement of the battery current IBAT.

Figure 2:
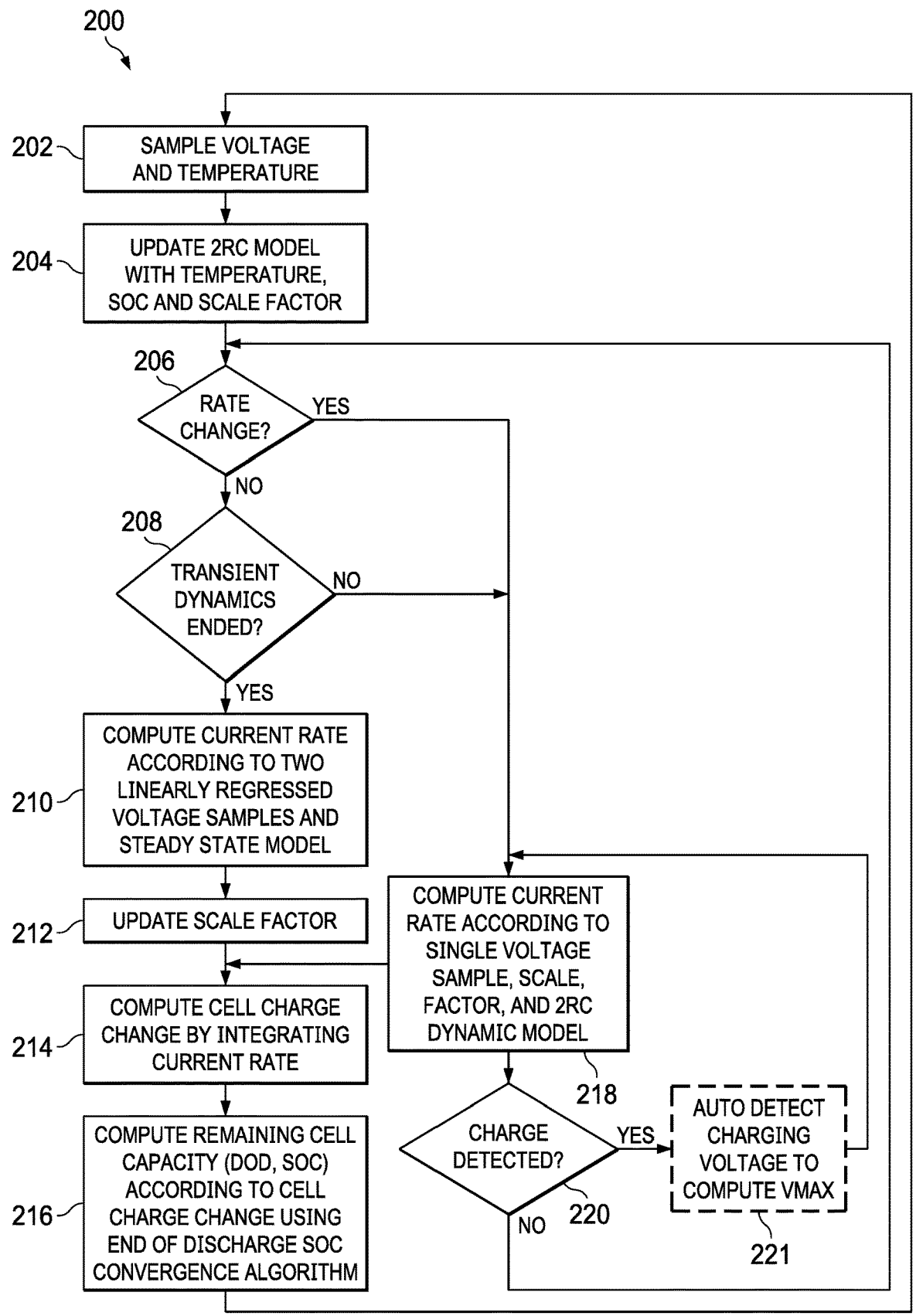
FIG. 2 is a flow diagram of an example method for managing the battery.

FIG. 2 is a flow diagram of an example method 200 for managing the battery. In one example, the processor 120 of FIG. 1 executes the program instructions 144 from the memory 122 to implement the method 200 of FIG. 2. The following is example code to implement the method 200:

```
QRateType_t get_advc_rate(uint8_t deltaT, uint8_t Use_ADVC)
{
    QRateType_t localQRate = EstimateRate(deltaT, Use_ADVC);
    ADVC_State_t theADVCState = NOT_ADVC;
    if (Use_ADVC && check_and_limit_qrate(&localQRate) && // check rate OK for adaptive mode
        check_dod_limits( ))
    {
        theADVCState = check_adaptive_mode(da_mVBatt( ));
        if (DO_ADVC_CALC == theADVCState) {
            CurrentEstimator.V1 = calc_regress_point_fp(&LinearRegressData, 0);
            CurrentEstimator.V2    =    calc_regress_point_fp(&LinearRegressData, AdvcCtrl.MeasureDoneTime);
            do_adaptive_mode_calc(&LastQRate, &CurrentEstimator.Zscale);
            (void)check_and_limit_qrate(&LastQRate);
        }
        /* the state of ADVC_WAITING means adaptive mode condition is
         * persisting. Keep using last calculation until a new measurement
         * qualifies or if the load changes will have NOT_ADVC */
    }
    if (NOT_ADVC == theADVCState) {
        LastQRate = localQRate; // so just use EstimateRate value
    }
    return LastQRate;
} /* get_advc_rate */
```

In one example, the memory 122 is programmed with model parameters 152, including parameters R1, C1, R2, C2 and R0 that represent the impedance of a battery type, and $Q_{max}$ that represents the battery capacity in coulombs. In operation at 202, the processor samples the battery voltage VBAT and the battery temperature. In one example, the processor 120 receives a first battery voltage value (e.g., an instantaneous battery voltage sample) Vk from the ADC 140 that represents the voltage VBAT at a sample time k, and receives a temperature sample Tk from the ADC 142 that represents the battery temperature at the sample time k. At 204, the processor 120 updates the 2RC dynamic battery model 150 with the sampled temperature, as well as the state of charge SOC 160 and the scale factor 156 computed in a previous cycle. The following is example code to implement the process 200 at 202 and 204 using newly collected sample data:

```
DOD dodtemp;
lQmax_A_sec = ((float32_t)lQmax * 3600) / 1000.0;
if (zt_flash.Gauging2.b.UseDvcRCConst) {
    Tau1 = exp(-fTs/RC1);
    Tau2 = exp(-fTs/RC2);
}
else {
    Tau1 = exp(-fTs/(r1 * c1));
    Tau2 = exp(-fTs/(CurrentEstimator.r2 * c2));
}
dodtemp = (DOD)CurrentEstimator.DOD_DVC;
CurrentEstimator.Prevu = (float32_t)Calc_V_from_dod(dodtemp, da_dKCellTemp( ));
// RC 1 pair
CurrentEstimator.PrevV = Tau1 * CurrentEstimator.PrevV;         // 1st term
CurrentEstimator.PrevV  +=  ((lQmax_A_sec  *  AdvcResult.theRate *  r1  * CurrentEstimator.Zscale) /
        ((float32_t)Q_RATE_SCALE * ZSCALING)) * (1 - Tau1);
// RC 2 pair
CurrentEstimator.Prevw = Tau2 * CurrentEstimator.Prevw;
CurrentEstimator.Prevw += ((lQmax_A_sec * AdvcResult.theRate * CurrentEstimator.r2
* CurrentEstimator.Zscale) /
        ((float32_t)Q_RATE_SCALE * ZSCALING)) * (1 - Tau2);
fRate = ((((float32_t)da_mVBatt( ) - CurrentEstimator.Prevu) - CurrentEstimator.PrevV - CurrentEstimator.Prevw)/
        (((float32_t)CurrentEstimator.Zscale / ZSCALING) * CurrentEstimator.Rser *
lQmax_A_sec * MILLIVOLTPERVOLT);
CurrentEstimator.DOD_DVC -= fRate * fTs * MAX_DOD;
rate_out = round(fRate * 3600 * Q_RATE_SCALE);
```

At 206 and 208, the processor 120 executes the program instructions 144 from the memory 122 to determine whether the associated battery 104 is currently operating in a steady state mode or in a dynamic mode. In the example of FIG. 2, the processor 120 determines that the associated battery 104 is operating in the steady state mode in response to detecting a change in the current rate 154, or determine that the associated battery 104 is operating in the dynamic mode in response to detecting no change in the current rate 154 for a non-zero time. At 206, the processor 120 determines whether the current rate computed for the previous cycle has changed significantly from an earlier value. In one example, the processor 120 compares the two most recently computed values of the current rate at 206, and determines that the rate has changed if the average rate of change in voltage exceeds a predetermined threshold amount such as 5 mV. If no significant rate change is determined (NO at 206), the processor 120 determines whether battery transient dynamics have ended at 208. In one example, the processor starts a timer with a predetermined time value when dynamics are initially detected, and checks the timer at 208. If the timer has expired (YES at 208), the processor 120 determines that the associated battery 104 is operating in a steady state mode. The following is example code to implement the process 200 at 206 and 208:

```
static ADVC_State_t check_adaptive_mode(MilliVolt_t Vin)
{
    static SecondsWord_t TransientTime;
    static ADVC_State_t  rtnVal;   // inits to zero, is NOT_ADVC
    MilliVolt_t VDelta;
    if (DO_ADVC_CALC == rtnVal) {
        rtnVal = ADVC_WAITING;
    }
    if (NeedMeasure) {
        MeasureTime++;
        if (build_average(&V2avg, Vin, AdvcCtrl.VAvgSpan)) {
            VDelta = abs_int(V1avg - V2avg);
            V1avg = V2avg;
            if (VDelta > AdvcCtrl.LoadChangeDetect) {
                NeedMeasure = false; /* force to start over */
                MeasureTime = 0;
                rtnVal = NOT_ADVC;
            }
            else if (MeasureTime >= AdvcCtrl.MeasureDoneTime) { /* Now can do the
Adaptive calculation */
                add_regress_point_fp(&LinearRegressData, MeasureTime, Vin);
                MeasureTime = 0;
                rtnVal = DO_ADVC_CALC;
                /* Some trickery to get more measurements during constant load
discharges */
                NeedMeasure = false;
                NeedTransient = true;
                V1avg = V2avg;           /* Already have the new V1 and with no
load change don't have to wait for transient */
                TransientTime = AdvcCtrl.TransientDoneTime; /* See below that load
change will be caught */
            }
            else {
                add_regress_point_fp(&LinearRegressData, MeasureTime, Vin);
            }
        }
    }
    // Using averages look for constant load - happens as new load level has occurred
    else if (needV1avg) {
        if (build_average(&V1avg, Vin, AdvcCtrl.VAvgSpan)) {
            VDelta = abs_int(V1avg - V2avg);
            if (VDelta <= AdvcCtrl.LoadChangeDetect) {
                NeedTransient = true;
                needV1avg = false;
            }
            else {
                V2avg = V1avg;
            }
        }
    }
    else if (NeedTransient) { /* load to be constant until transiennts are done */
        TransientTime++;
        if (build_average(&V2avg, Vin, AdvcCtrl.VAvgSpan)) {
            VDelta = abs_int(V1avg - V2avg);
            if (VDelta <= AdvcCtrl.LoadChangeDetect) {
                V1avg = V2avg;
                if (TransientTime >= AdvcCtrl.TransientDoneTime) {
                    NeedTransient = false;
                    NeedMeasure = true;
```

```
                add_regress_point_fp(&LinearRegressData, MeasureTime, Vin);
                CurrentEstimator.DODx = CurrentEstimator.DOD_DVC;
                CurrentEstimator.ADVCStartTemperature                =
da_val.dKCellTemp;
            }
        }
        else { // load change - forced to start over
            NeedTransient = false;
            rtnVal = NOT_ADVC;
        }
    }
}
    else { /* Have to start or start over if the load changed */
        needV1avg = true;
        TransientTime = 0;
        MeasureTime = 0;
        rtnVal = NOT_ADVC;
        (void)build_average(&V1avg, Vin, 1); // initializes
        init_regress_fp(&LinearRegressData);
    }
    return rtnVal;
} /* check_adaptive_mode */
```

In response to determining that the battery 104 is operating in the steady state mode, the processor 120 computes a new current rate at 210 (e.g., RATE 154 in FIG. 1) according to (e.g., in response to or based upon) two or more previous voltage values and the battery temperature. In one example, the processor 120 computes the rate at 210 according to voltage values Vk and Vk+1, where Vk and Vk+1 are the values obtained by fitting successive voltage samples to a straight line using piecewise linear regression. Vk and Vk+1 are the end point values of the fitted straight line, and the steady state model 146 stored in the memory 122. At 212, the processor 120 computes and updates the scale factor 156 that represents the deviation in the normalized resistance of the associated battery 104 according to the first battery voltage sample $V_k$. The following is example code to implement the process 200 at 210, 212, and 214:

```
static void do_adaptive_mode_calc(QRateType_t *LastCRate, int16_t *RScale)
{
    float32_t scratch1, scratch2;    // simplify the code for the calculation
    float32_t den1, den2;                                // rate denominators
    float32_t lQmax;
    float32_t rate1, rate2, rate3;
    float32_t Vdiff;
    int16_t MaxRScaleDelta;
    lQmax = get_Qmax_mAh( ); // its scaled
    lQmax *= SECONDS_IN_HOUR;
    lQmax /= MILLIAMPPERAMP;         // Get the units correct
    // Slope and intercept at grid for OCV curve
    find_OCV_linear_coeff(&theOCVCoeffs);
    // Slope and intercept at grid for impedance curve
    find_Ra_linear_coeff(&theRaCoeffs);
    // first the Rate calculation
    Vdiff = CurrentEstimator.V1 - CurrentEstimator.V2;
    scratch1 = theOCVCoeffs.slope * theRaCoeffs.intercept;
    scratch1 -= theOCVCoeffs.intercept * theRaCoeffs.slope;
    /* default to old rate if calculation should be bad */
    rate1 = (float32_t)(*LastCRate * MILLIAMPPERAMP) / ZSCALING;
        rate2 = rate1;
    den1 = AdvcCtrl.MeasureDoneTime * (scratch1 + theRaCoeffs.slope * CurrentEstimator.V1);
    den2 = AdvcCtrl.MeasureDoneTime * (scratch1 + theRaCoeffs.slope * CurrentEstimator.V2);
    if (ABS1(den1) > (float32_t)0.000001) { // avoid division by a really small number
        rate1      =      theRaCoeffs.intercept     +      (theRaCoeffs.slope     *
(CurrentEstimator.DODx/MAX_DOD));
        rate1 *= Vdiff;
        rate1 /= den1;
    }
    if (ABS1(den2) > (float32_t)0.000001) { // avoid division by a really small number
        rate2      =      theRaCoeffs.intercept     +      (theRaCoeffs.slope     *
(CurrentEstimator.DOD_DVC/MAX_DOD));
        rate2 *= Vdiff;
        rate2 /= den2;
    }
    rate3 = Vdiff / (AdvcCtrl.MeasureDoneTime * theOCVCoeffs.slope);
    rate1 = (rate1 + rate2 + rate3) / 3.0;
    *LastCRate = (int16_t)(Q_RATE_SCALE * rate1 * SECONDS_IN_HOUR);
    // !!! may need to filter here
    // Now prepare for the RScale calculation
    den1     =     rate1     *     lQmax     *     Calc_R_from_dod((DOD)(CurrentEstimator.DODx),
```

```
CurrentEstimator.ADVCStartTemperature,
        CELL1, NO_RA0_INTERP);
    den2 = rate1 * lQmax * Calc_R_from_dod((DOD)(CurrentEstimator.DOD_DVC),
da_val.dKCellTemp, CELL1, NO_RA0_INTERP);
    /* avoid division by a really small number */
    if ((ABS1(den1) > (float32_t)0.0000001) && (ABS1(den2) > (float32_t)0.0000001)) {
        scratch1 = (CurrentEstimator.V1 - Calc_V_from_dod((DOD)(CurrentEstimator.DODx),
da_val.dKCellTemp)) / den1;
        scratch2 = (CurrentEstimator.V2
Calc_V_from_dod((DOD)(CurrentEstimator.DOD_DVC), da_val.dKCellTemp)) / den2;
        scratch1 = (scratch1 + scratch2) / 2.0;
        lclRScale = (int16_t)(scratch1 * ZSCALING); // unit scaling
        // Limit change per DF constant
        MaxRScaleDelta = AB_div_C(*RScale, AdvcCtrl.MaxRScalePercent, 100);
        if ((lclRScale - *RScale) > MaxRScaleDelta) {
            *RScale += MaxRScaleDelta;
        }
        else if ((*RScale - lclRScale) > MaxRScaleDelta) {
            *RScale -= MaxRScaleDelta;
        }
        else {
            *RScale = lclRScale;
        }
    }
    /* else it is unchanged */
} /* do_adaptive_mode_calc */
```

In one example, the memory 122 stores a steady-state model 146, and a lookup table 148 that represents the open circuit voltage $OCV(dod_k,T_k)$ and a resistance $R(dod_k,T_k)$ of a particular battery type for different battery temperatures. A normalized resistance can be calculated as the product $R(dod_k,T_k)*Q_{max}$. In one example, resistance and $Q_{max}$ are programmed. The processor 120 executes the program instructions 144 to determine an open circuit voltage value $OCV(dod_k,T_k)$ and a resistance value $R(dod_k,T_k)$ of the associated battery 104 by linear interpolation of the lookup table 148 according to the value of the temperature sample $T_k$, and the depth of discharge dod.

With default OCV and resistance values R stored as an array or lookup table in the memory 122, the processor determines values between any two grid points by linear interpolation. In this example, $OCV(dod_k,T_k)=v_a+v_b*dod_k$, and $R(dod_k,T_k)=r_a+r_b*dod_k$, and $dod_k$ is the most recently computed capacity value 160 (e.g., DOD as a percentage=100–SOC). In one example, the processor 120 uses a resistance or "R" steady state model 146 which is expressed in terms of the normalized resistance, rate and scale factor by the following equations (1)-(3):

$$V_k = OCV(dod_k,T_k) + Rate*R(dod_k,T_k)*Scale*Q_{max} \quad (1)$$

$$V_k = (v_a+v_b*dod_k) + Rate*(r_a+r_b*dod_k)*Scale*Q_{max} \quad (2)$$

$$V_{k+1} = (v_a+v_b*dod_{k+1}) + Rate*(r_a+r_b*dod_{k+1})*Scale*Q_{max} \quad (3)$$

The processor 120 in one example computes voltage samples $V_k$ and $V_{k+1}$ by fitting successive voltage samples to a straight line using piecewise linear regression. $V_k$ and $V_{k+1}$ are the end point values of the fitted straight line, where the elapsed time between the values $V_k$ and $V_{k+1}$ (e.g., the time between the indexes k and k+1) is not the sample time. Substituting the coulomb counting equation, $dod_{k+1}=dod_k-$ Rate*Elapsed Time into equations (1)-(3) for voltage yields two equations in two unknowns, Rate and Scale. In one example, the processor 120 computes the current rate 154 and the scale factor 156 according to the following equations (4) and (5):

$$\text{Rate} = (V_k - V_{k+1})*(r_a + r_b*dod_k)/[\text{ElapsedTime}*(v_b*r_a - v_a*r_b + r_b*V_k)] \quad (4)$$

$$\text{Scale} = -(v_a - V_k + v_b*dod_k)/[\text{Rate}*Q_{max}*(r_a + r_b*dod_k)] \quad (5)$$

The processor 120 computes the current rate 154 at 210 according to two or more voltage samples, e.g., according to the fitted voltage values $V_k$, $V_{k+1}$ by piecewise linear regression using the open circuit voltage value $OCV(dod_k,T_k)$, and the resistance value $R(dod_k,T_k)$. At 216, the processor 120 computes the scale factor 156 according to at least one of $V_k$ or $V_{k+1}$, the open circuit voltage value $OCV(dod_k,T_k)$, and the resistance value $R(dod_k,T_k)$.

At 214, the processor 120 computes the battery cell charge change by integrating the current rate (e.g., by coulomb counting). At 216, the processor 120 computes the remaining capacity 160 of the associated battery 104, for example, as state of charge (SOC) or depth of discharge (DOD) 104, according to the current rate 154. In one example, the processor 120 computes the SOC as a value that ranges from 0% to 100% and computes the DOD value as 100%–SOC. In one example, the processor 120 processor computes the remaining capacity at 216 using an end of discharge SOC convergence algorithm as described further below in connection with FIG. 16. In one example, the processor 120 computes the remaining capacity 160 at 216 as a present depth of discharge (DOD) value $DOD_{k+1}$ for the associated battery 104 according to a previous DOD value $DOD_k$ and the current rate 154. In one example, the processor 120 provides the remaining capacity of the associated battery 104 to the connected host circuit 110 via the communications interface 124, 126. The processor 120 then returns to 202 to sample the battery voltage and temperature for the next cycle. The following is example code to implement the process 200 at 214:

```
void update_advc_model(uint16_t *DvcDebugRegs)
{
    float32_t dcharge;
    MilliAmpHour_t lQmax = get_Qmax_mAh( );
    MilliAmp_t Current;
    sr_write_word(&AdvcResult.theRate, get_advc_rate(1, zt_flash.Gauging2.b.UseAdvc)); // Has to
run each DeltaT time
    sr_write_word(&AdvcResult.Rscale, CurrentEstimator.Zscale);
    /* fill in debug info */
    sr_write_word(DvcDebugRegs, round(CurrentEstimator.Rser * 1000));
        sr_write_word(DvcDebugRegs + 1, round(CurrentEstimator.Cser / 10));
    sr_write_word(DvcDebugRegs + 2, round(1000 * CurrentEstimator.r2));  //Label in EVSW: r2
    sr_write_word(DvcDebugRegs + 3, round(CurrentEstimator.DOD_DVC));      //Label      in
EVSE:DVC_DOD
    sr_write_word(DvcDebugRegs + 4, round(CurrentEstimator.Prevu));        //Label      in
EVSW:DVC_OCV
    sr_write_word(DvcDebugRegs + 5, round(CurrentEstimator.PrevV) * 1000);   //Label      in
EVSE:CE.PrevV
    sr_write_word(DvcDebugRegs + 6, round(CurrentEstimator.Prevw) * 1000);   //Label      in
EVSE:Prevw
        Current = AB_div_C(AdvcResult.theRate, lQmax, Q_RATE_SCALE);
        dcharge = ((float32_t)Current) * COULOMBCONV;
dcharge is then used in the usual manner for our BMS gauges to integrate the charge to determine SOC and
remaining capacity.
```

If the processor 120 detects a significant rate change (YES at 206 in FIG. 2), the processor 120 determines that the associated battery 104 is operating in a dynamic mode. In response to this dynamic mode determination, the processor (e.g., by coulomb counting), and the processor 120 computes the remaining capacity 160 of the associated battery 104 at 216 as described hereinabove. The following is example code to implement the process 200 at 216:

```
PercentChar_t do_advc_rsoc_convergence(PercentChar_t RsocIn)
{
    static PercentChar_t PrevSOC;
    static MilliVolt_t PrevV;
    PercentChar_t theSOC = RsocIn;
    int16_t ConvrgTerm;              /* scale by 255 */
    bool ComputeConvergence = false;
    if (!zt_flash.Gauging2.b.AdvcRsoc || (da_mVAvgVoltage( ) <= IT.Simulation.TerminateVoltage))
    {
        return theSOC; /* nothing to do here then */
    }
    if ((RsocIn < AdvcCtrl.RSOCCnvgPcnt) || (da_mVAvgVoltage( ) < AdvcCtrl.RSOCCnvgmV)) {
        ComputeConvergence = true;
    }
    if (ComputeConvergence) {
        /* Note use of filtered voltages here
           Some scaling is applied
           to avoid floating point...which would be overkill */
        ConvrgTerm = AB_div_C((da_mVAvgVoltage( ) - PrevV), CONVRGSCALE,
            (PrevV - IT.Simulation.TerminateVoltage));
        ConvrgTerm += CONVRGSCALE;
        theSOC = AB_div_C(PrevSOC, ConvrgTerm, CONVRGSCALE);
    }
    PrevV = da_mVAvgVoltage( );
    PrevSOC = theSOC;
    return theSOC;
}
```

120 computes the current rate 154 at 218 according to the instantaneous battery voltage sample (e.g., the first voltage sample), the temperature sample, the scale factor 156, and the dynamic model 150 of the associated battery 104. In one example, the dynamic model 150 of the associated battery 104 is a model, for example, a 2RC model, and the memory 122 stores dynamic model parameters 152 ($R_1$, $C_1$, $R_2$, $C_2$, $R_0$, and $Q_{max}$) that represent a particular battery type. The processor 120 executes the program instructions 144 from the memory 122 to compute the current rate 154 at 218 according to the instantaneous battery voltage sample, the temperature sample $T_k$, the scale factor 156, and the dynamic model parameters 152. At 214, the processor 120 computes the battery cell charge change by integrating the current rate In the example of FIG. 2, the dynamic model is also used during battery charging. In this example, the processor 120 determines whether charging is detected at 220. If not (NO at 220), the processor 120 again determines the operating mode at 206 and 208 as described hereinabove. If the processor 120 determines that the battery 104 is charging (YES at 220), the processor 120 computes a maximum SOC value (e.g., minimum DOD value) at 221 by automatically detecting a maximum charging voltage of the associated battery 104, as described further below in connection with FIGS. 17-21.

In one example, the processor 120 computes the current rate 154 for dynamic mode operation according to the following equations (6)-(8):

$$V_1(k) = \exp\left(\frac{-\Delta t}{R_1 C_1}\right) * V_1(k-1) + \quad (6)$$

$$\text{prev\_rate} * \text{Scale} * Q_{max} * R_1 * \left[1 - \exp\left(\frac{-\Delta t}{R_1 C_1}\right)\right]$$

$$V_2(k) = \exp\left(\frac{-\Delta t}{R_2 C_2}\right) * V_2(k-1) + \quad (7)$$

$$\text{prev\_rate} * \text{Scale} * Q_{max} * R_2 * \left[1 - \exp\left(\frac{-\Delta t}{R_2 C_2}\right)\right]$$

$$\text{rate} = \left(\frac{v(k) - OCV(k) - V_1(k) - V_2(k)}{\text{Scale} * Q_{max} * R_0}\right) \quad (8)$$

where the parameters $R_1$, $C_1$, $R_2$, $C_2$, $R_0$ and $Q_{max}$ are default values programmed into the memory 122 according to a model of the battery 104 described below in connection with FIG. 5.

The illustrated examples provide battery fuel gauge functions for battery management systems to accurately estimate and report remaining battery capacity in terms of SOC and/or DOD to facilitate enhanced battery run time for a given host circuit 110. Accurate battery capacity estimation can be done using a sense resistor for current measurement as well as configuration by programming the correct battery parameters such as low frequency impedance and chemical capacity. The disclosed examples provide a low power and cost effective solution for applications such as wearables without requiring a sense resistor or accurate module programming. This provides a simple and easy to use plug and play fuel gauge solution for end equipment and battery pack manufacturers with minimum to zero configuration. Described examples provide accurate current estimates without depending on any additional configuration of model parameters such as resistance and Qmax by estimating the current rate (defined in one example as the ratio of current and Qmax) instead of current and using the normalized resistance (defined in one example as the product of resistance and capacity). In one example, the lookup table 148 is programmed with the resistance, capacity and OCV of a cell such that the table values have the least deviation amongst the cells of a particular charging voltage.

Figure 3:
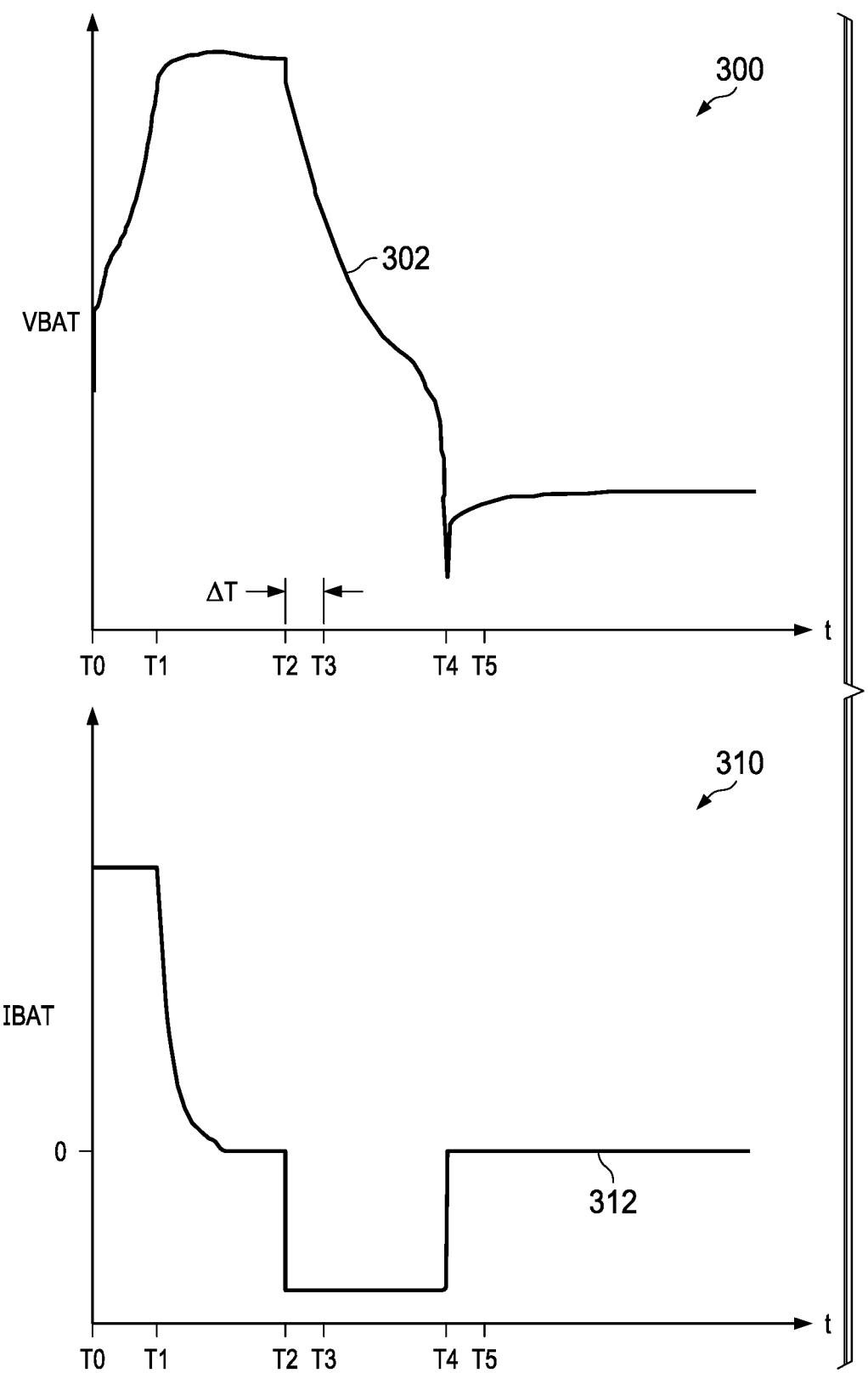
FIG. 3 shows graphs of battery voltage and current over an example charging and discharging cycle.

FIG. 3 shows a graph 300 with a curve 302 that illustrates the battery voltage (VBAT), and a graph 310 with a curve 312 that illustrates the battery current (IBAT) during an example charging and discharging cycle. The battery voltage curve 302 increases during charging from time T0 with an initially constant charging current shown in the curve 312. As the battery voltage curve 302 approaches a maximum at T1, the current curve 312 begins to decrease, and eventually reaches zero. During this time, the processor 120 detects that the battery is charging (YES at 220 in FIG. 2), and computes the current rate at 218 using the dynamic model 150.

From T3 through T4, the processor 120 uses the steady-state model 146 for estimating the current rate. At T4, the associated battery 104 begins providing current to the host circuit 110, and the battery voltage curve 302 begins to decrease. In response to detecting a threshold amount of change in the current rate at T2, the processor 120 uses the dynamic model 150 for a predetermined time $\Delta T$ from T2 through T3 to allow any transient dynamics to settle before determining that the associated battery 104 is operating in a steady-state mode at T3. In response to detecting a stabilized current rate at T3, the processor 120 resumes current rate estimation using the steady-state model 146 from T3 through T4. In response to detecting a significant change in the current rate at T4, the processor 120 again uses the dynamic model 150 to estimate the current rate from T4 through T5, and thereafter uses the steady-state model 146.

The controller IC 102 in one example implements rate estimation in the dynamic region of battery operation, as well as rate estimation in the steady state region of battery operation. The dynamic region in one example includes abrupt changes in the applied load and when the battery 104 is under the transient effect (e.g., due to diffusion) after a load change. While the battery is operated in this region, the rate is estimated from a single voltage value $V_k$ using a battery model representing a network of resistances and capacitances. The same approach is also used to estimate the rate while the battery 104 is being charged.

The steady state region of battery discharge occurs when all the transients associated with the change in load have settled and the variation in load is negligible. When the battery 104 is operated in this region, the rate is estimated from two voltage samples $V_k$ and $V_{k+1}$. The effect of noise and high frequency pulses are minimized by fitting the voltage samples to a straight line using piecewise linear regression. Along with the current rate 154, the scale factor 156 for the normalized resistance is also estimated. This scale factor 156 helps account for the error associated with the normalized resistance during the dynamic rate estimation. The effect of aging on normalized resistance is accommodated by updating the scale factor at 212.

Figure 4:
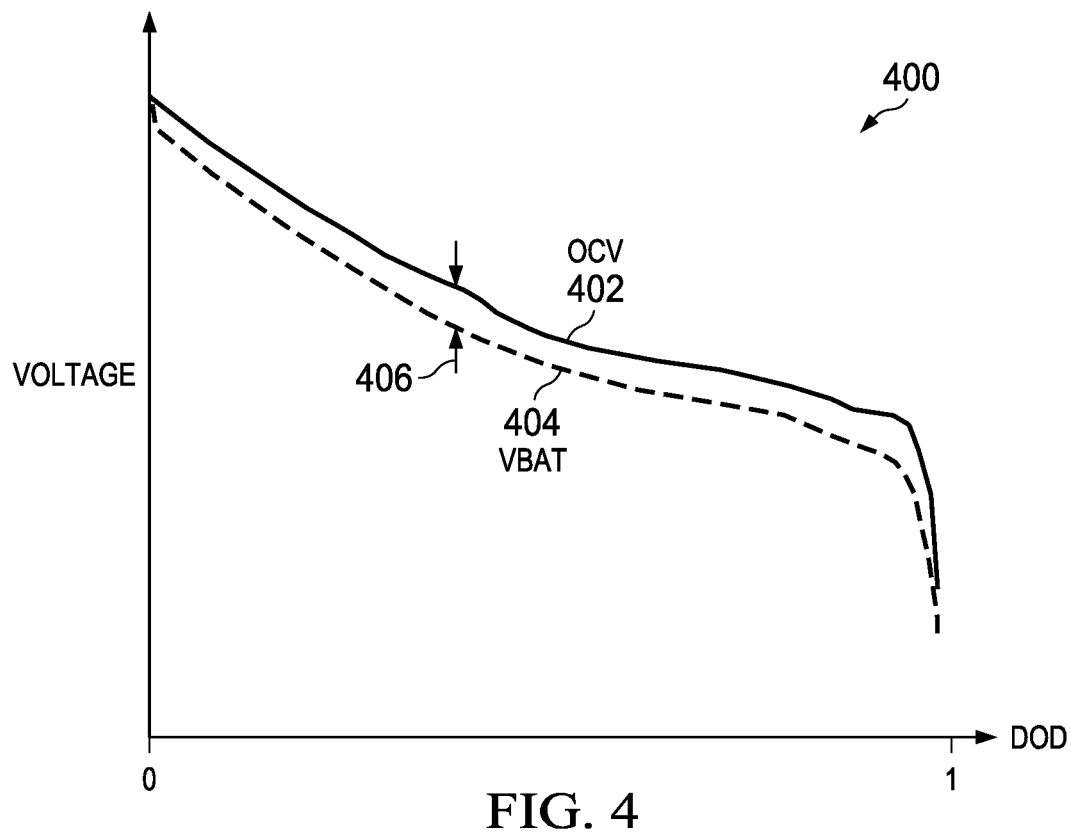
FIG. 4 is a graph including open circuit voltage and battery voltage curves illustrating the correlation error due to IR drop.

FIG. 4 shows a graph 400 including an open circuit voltage curve 402 and a corresponding battery voltage curve 404 (VBAT) as a function of depth of discharge (DOD). The graph 400 illustrates the correlation error due to an IR drop amount 406 caused by the internal battery resistance. Without directly measuring a battery current IBAT, and using only voltage correlation, the SOC can be determined by directly correlating OCV to SOC. However, the error due to the IR voltage drop 406 leads to error in the estimated SOC or DOD. Failure to account for the IR drop 406 in estimated remaining battery capacity (e.g., SOC or DOD) leads to large estimation errors, particularly for large current rates.

The example implementations of the battery management system 100 and controller IC 102 use a zero configuration gauging algorithm that mitigates or minimizes the error in estimated current due to unknown battery model parameters. In particular, the example controller IC 102 estimates the current rate 154 (e.g., the ratio of current and $Q_{max}$) instead of estimated current. This accounts for an unknown Qmax, while allowing one-time programming of the controller IC 102. In addition, the example controller IC 102 uses normalized resistance R (e.g., defined in one example as the product of resistance and $Q_{max}$) as resistance by itself may not be sufficient to quantify the difference between two cells. One example uses normalized resistance where the deviation between cells can easily be quantified using a single scale factor to account for unknown battery resistance and capacity. The controller IC 102 uses a 2RC dynamic model 150 to determine the rate 154 from the instantaneous voltage sample in the dynamic region of battery discharge (such as change in load, transient period after load change) as well as during battery charging. During steady-state operation, the controller IC 102 uses an R model 146 to compute the current rate 154 and the scale factor 156 from two or more voltage samples computed scale factor 156 is fed back into the dynamic 2RC model 150 to improve the rate estimation in the dynamic region.

FIG. 5 shows an example 2RC dynamic battery model 150 in schematic form, including an open circuit voltage (OCV) 502 connected in series with a resistance R0, and two RC circuits between the positive and negative battery terminals to provide the battery voltage VBAT. A parallel combination of a resistor R1 and a first capacitor C1 form a first order component, and an additional first order component is formed by a second resistor R2 in parallel with a second capacitor C2. The dynamic model 150 stored in the memory 122 in the controller IC 102 includes default parameters for the components R0, R1, R2, C1 and C2. The open circuit voltage OCV of the modeled battery is represented in the entries of the lookup table 148 of the steady state model 146.

FIGS. 6-17 illustrate simulation results for an example implementation of the controller IC 102 in a battery management system 100. FIGS. 6-11 illustrate room temperature discharge performance of the system 100 for a 280 mA hour, 4.35 V associated battery 104. In these simulations, the initial battery model parameters 152 are stored in the memory 122, which correspond to a 3,100 mA hour, 4.4 V battery type. The simulations demonstrate that a one time programming operation can be used to set the initial battery parameters 152, and subsequent use with a particular associated battery 104 results in convergence of the estimated remaining state of charge without direct measurement of the battery current IBAT, and without reprogramming of the memory 122.

Figure 6:
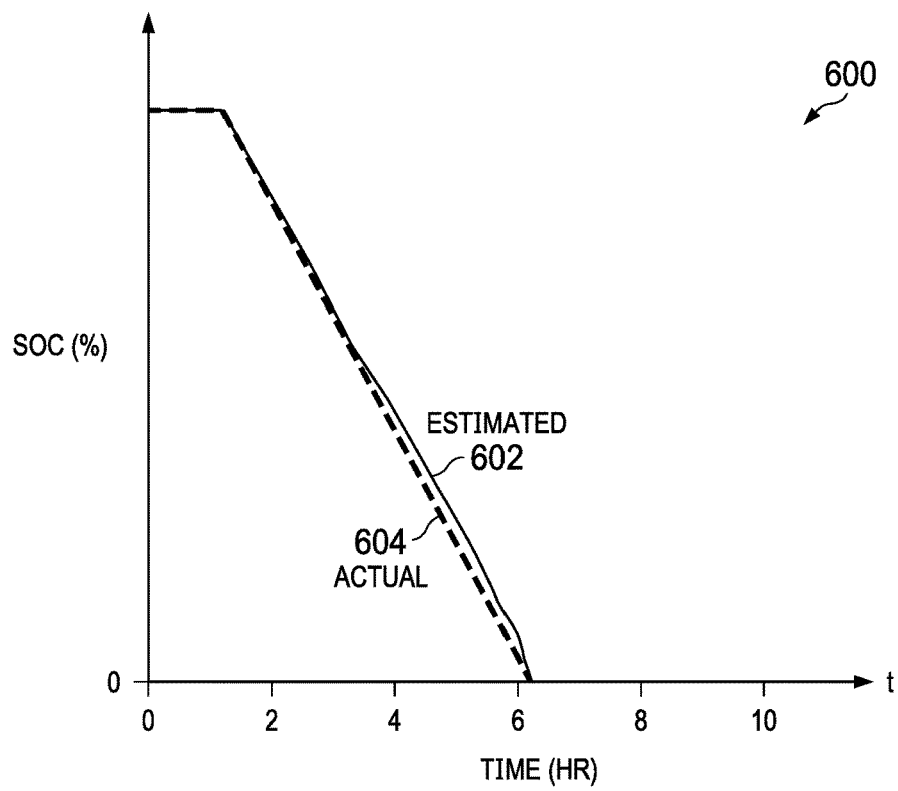
FIG. 6 is a graph of estimated and true remaining state of charge (SOC) for a first battery discharge cycle of a battery at room temperature.
Figure 7:
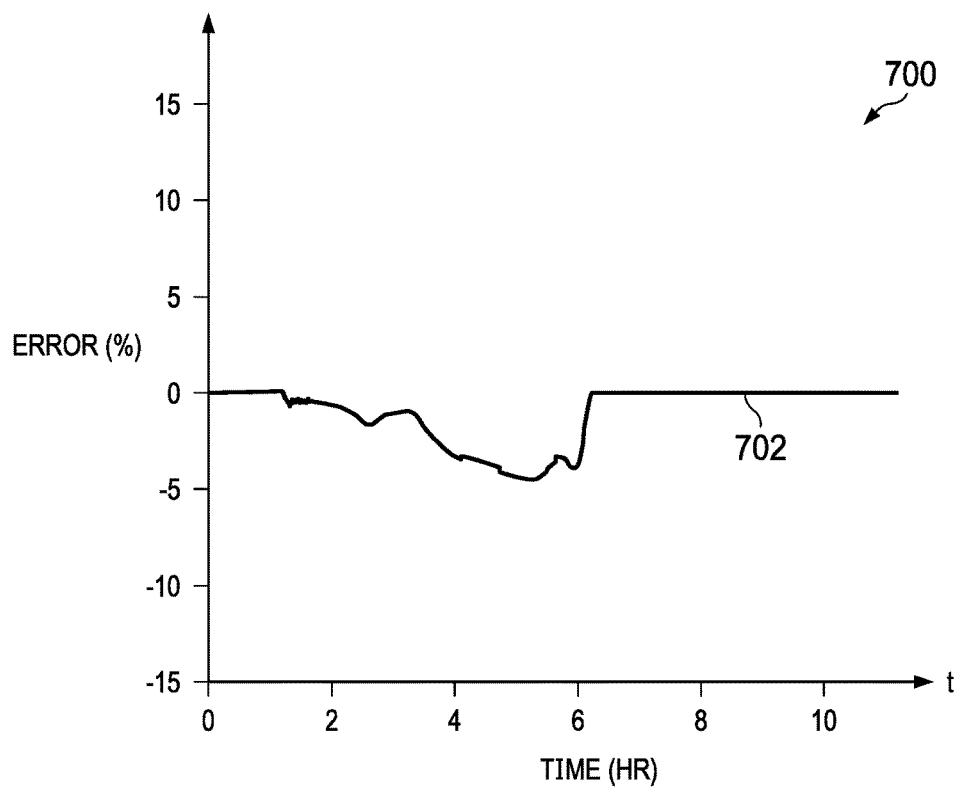
FIG. 7 is a graph of SOC error for the first battery discharge cycle of FIG. 6.
Figure 8:
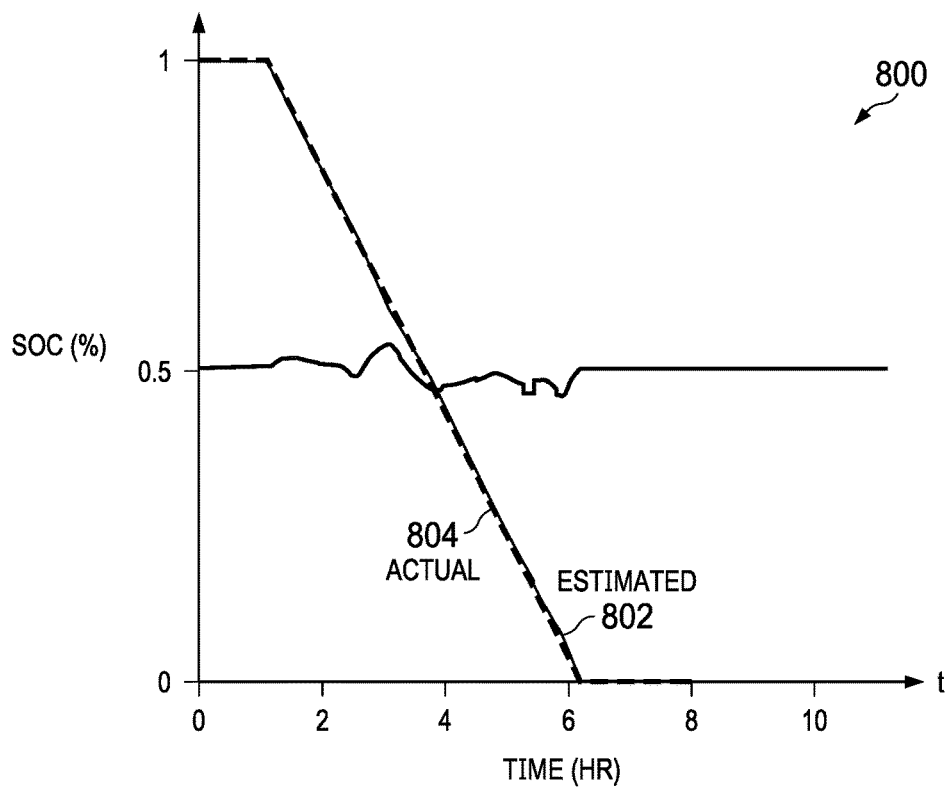
FIG. 8 is a graph of estimated and true remaining SOC for another battery discharge cycle of the battery at room temperature after convergence of a scale factor.
Figure 9:
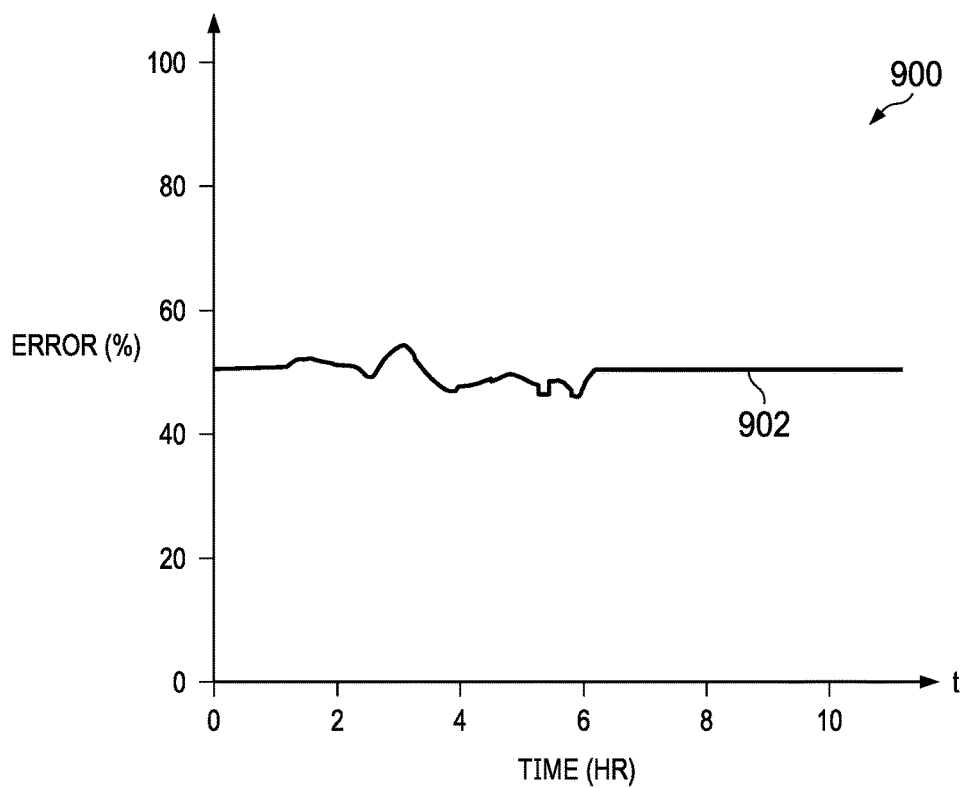
FIG. 9 is a graph of SOC error for the battery discharge cycle of FIG. 8.
Figure 10:
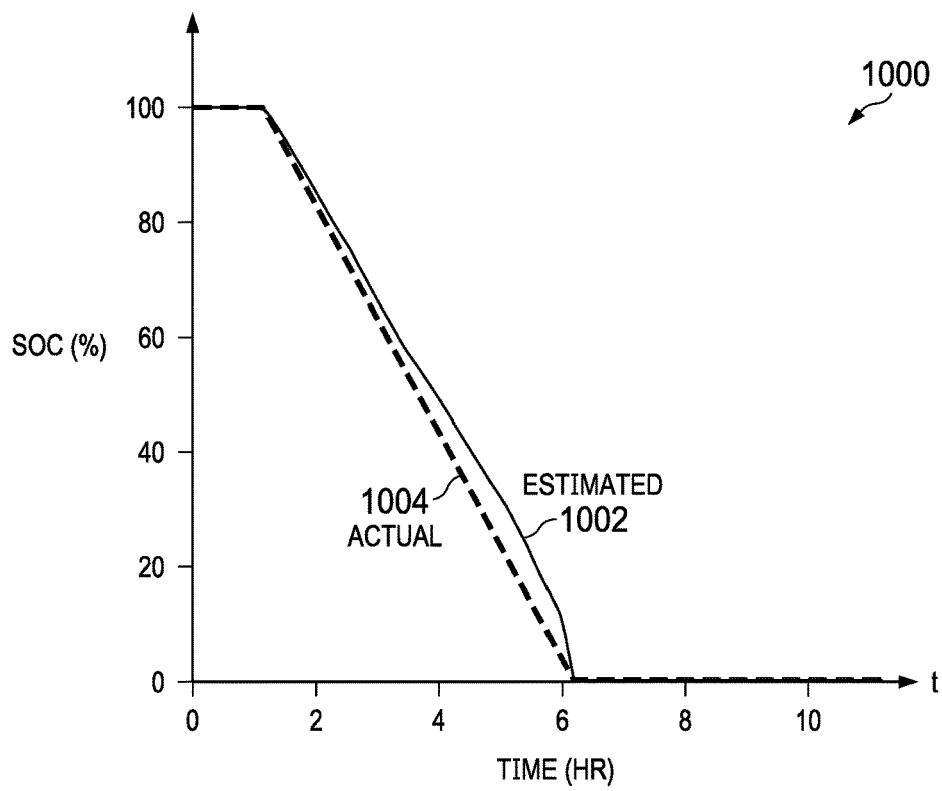
FIG. 10 is a graph of estimated and true remaining SOC for a battery discharge cycle of the battery at room temperature with no scale update.
Figure 11:
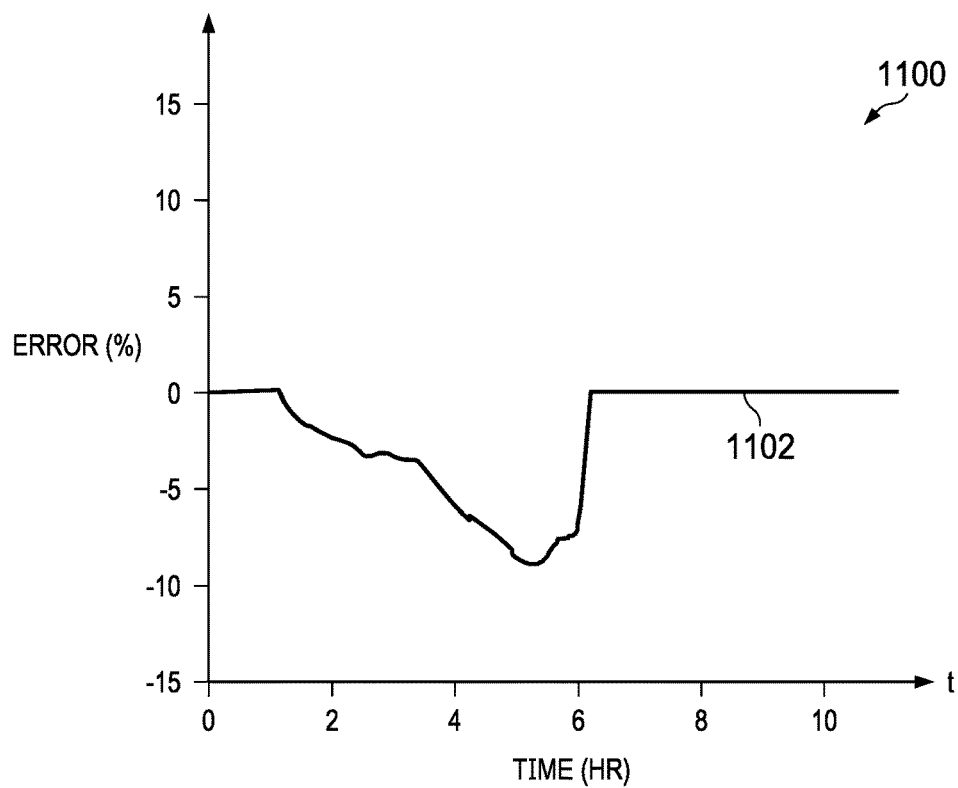
FIG. 11 is a graph of SOC error for the battery discharge cycle of FIG. 10.

FIG. 6 shows a graph 600, including an estimated remaining SOC curve 602 and an actual remaining SOC curve 604 for a first battery discharge cycle of an associated battery 104 at room temperature in the system 100 of FIG. 1. FIG. 7 shows a graph 700 including a curve 702 showing the SOC error for the first battery discharge cycle illustrated in FIG. 6. During the first discharge cycle of FIGS. 6 and 7, the estimated remaining SOC (curve 602) deviates from the actual remaining SOC (curve 604) by a significant amount. This is illustrated in the relatively large (e.g., negative) error in the curve 702 of FIG. 7. FIGS. 8 and 9 illustrate estimated remaining SOC and SOC estimation error for another battery discharge cycle of the associated battery 104 at room temperature after convergence of a scale factor. FIG. 8 shows a graph 800 that includes an estimated SOC curve 802 and an actual SOC curve 804. A graph 900 in FIG. 9 illustrates an SOC error curve 902 for the battery discharge cycle of FIG. 8. FIG. 10 shows a graph that includes a curve 1002 that shows estimated remaining SOC and a curve 1004 that shows true remaining SOC for a battery discharge cycle of the battery at room temperature with no scale update. A graph 1100 in FIG. 11 shows a curve 1102 of SOC error for the battery discharge cycle of FIG. 10. The updating provided by the controller IC 102 reduces the error shown in curve 902 compared with the curve 702 of FIG. 7 for the initial or first discharge cycle of the associated battery 104. In particular, the controller IC 102 employs updates in the estimated remaining capacity 160 and the scale factor 156, to facilitate use of a one-time programming operation to set the battery model parameters 152, while using a voltage based monitoring system without directly measuring the battery current IBAT. In operation, the example controller IC 102 improves the SOC accuracy for successive cycle as more and more accurate scale factors 156 are computed and used for estimating the current rate of the associated battery 104.

Figure 12:
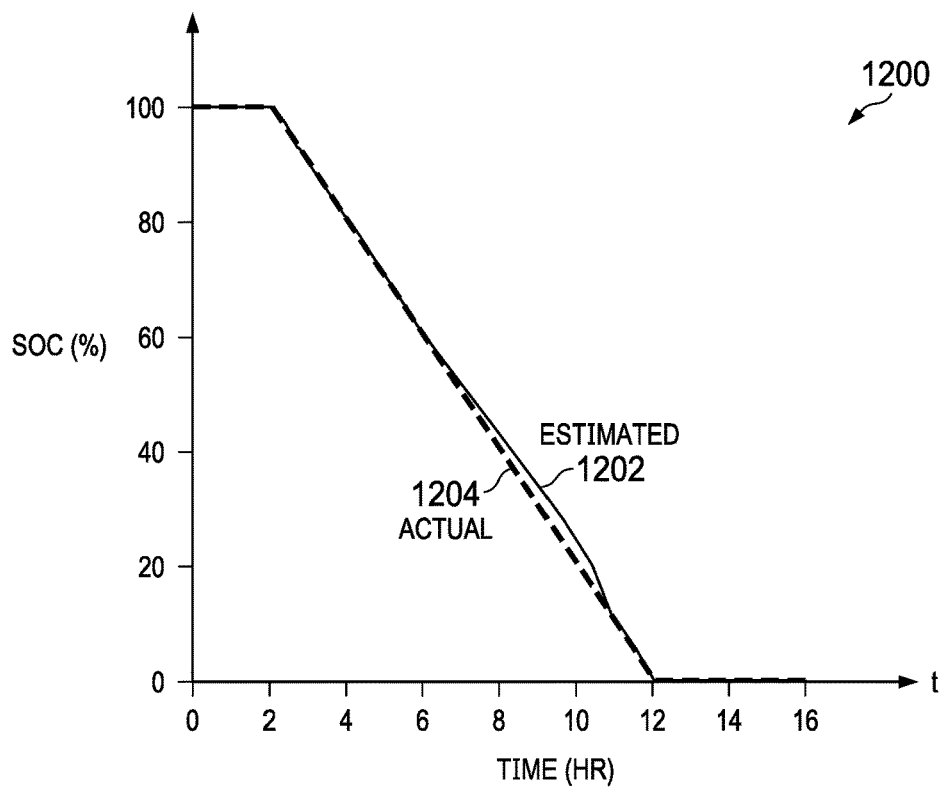
FIG. 12 is a graph of estimated and true remaining SOC for a first battery discharge cycle of a cold battery.
Figure 13:
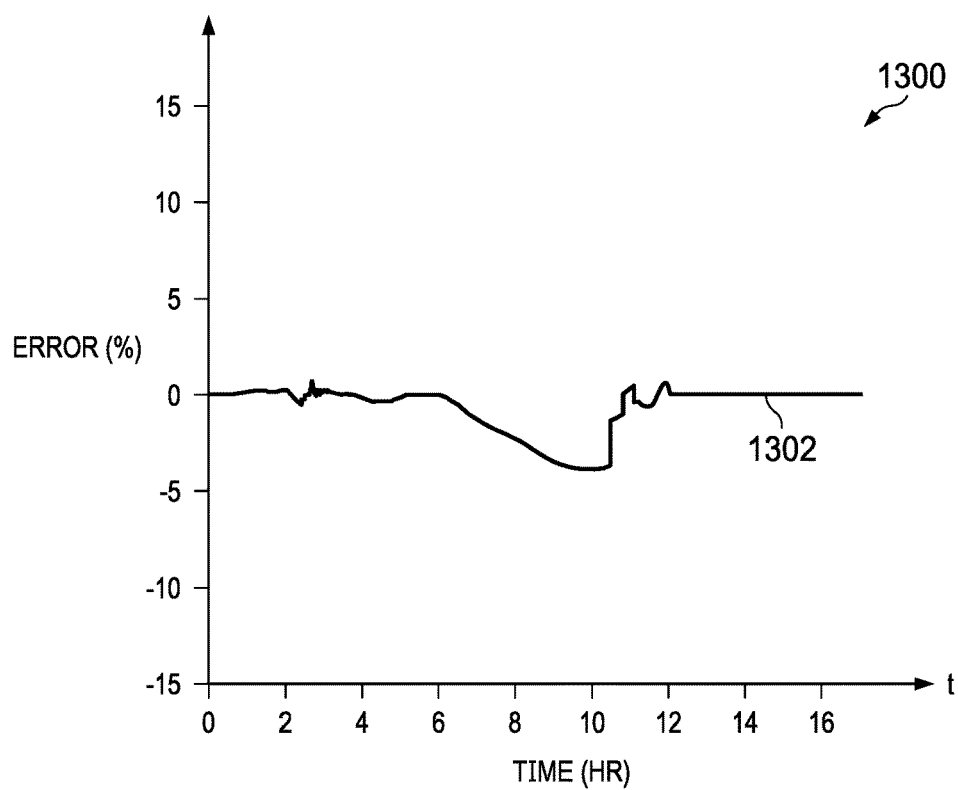
FIG. 13 is a graph of SOC error for the first battery discharge cycle of FIG. 12.
Figure 14:
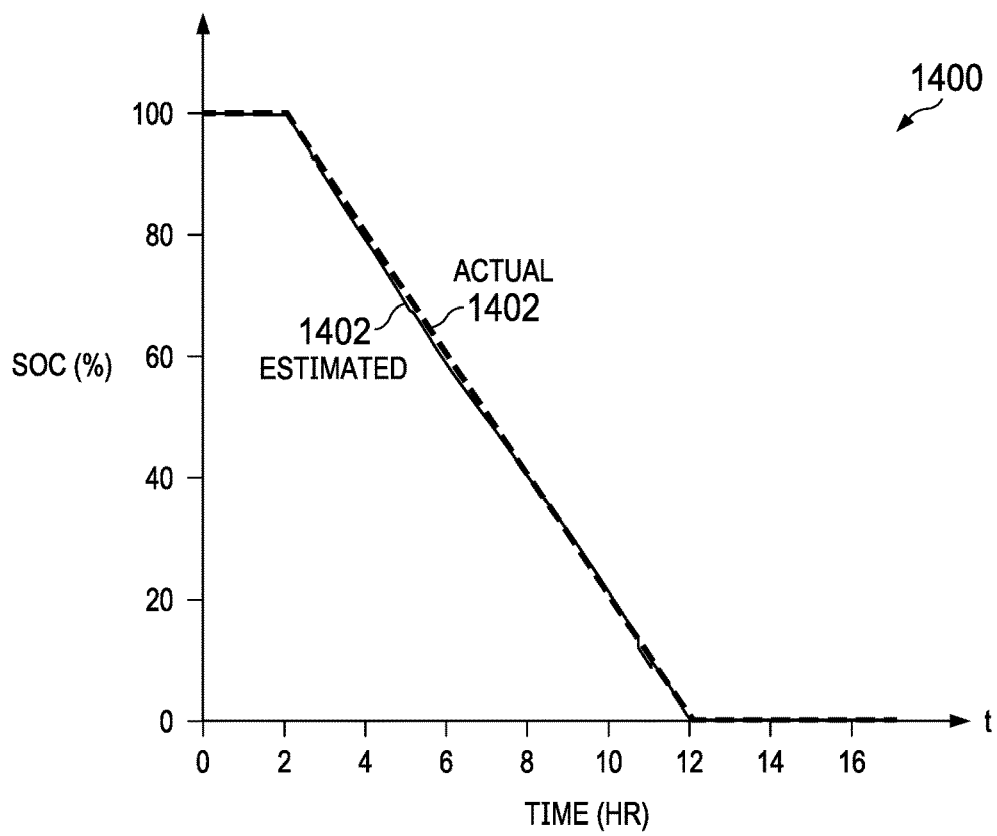
FIG. 14 is a graph of estimated and true remaining SOC for another battery discharge cycle of the cold battery after convergence of a scale factor.
Figure 15:
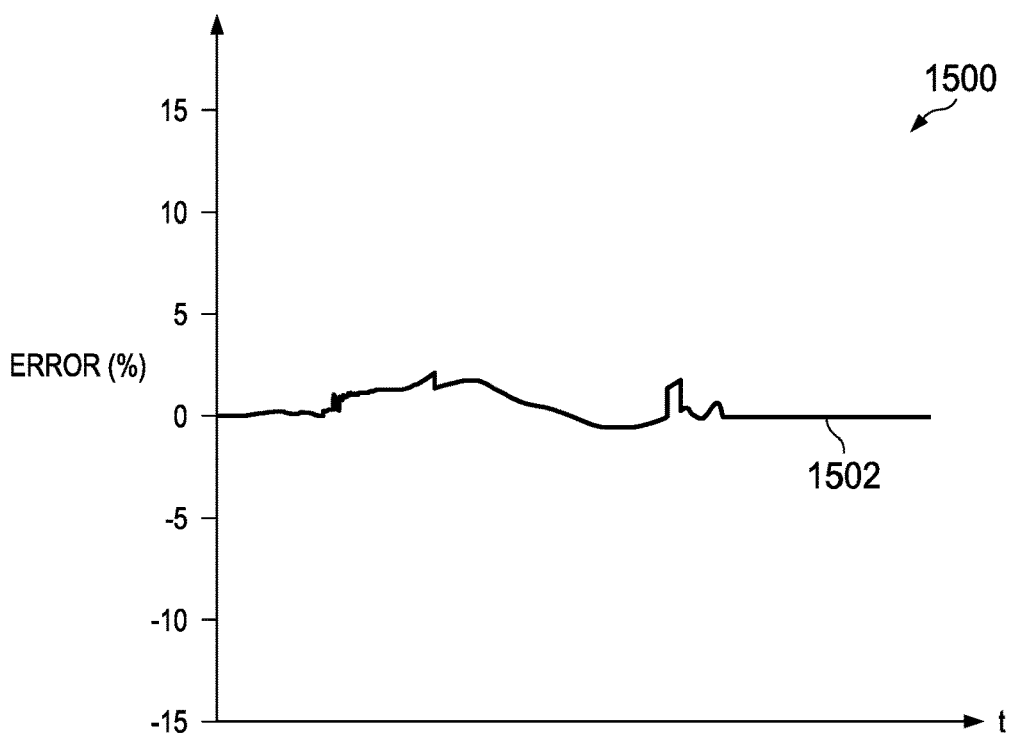
FIG. 15 is a graph of SOC error for the battery discharge cycle of FIG. 14.
Figure 16:
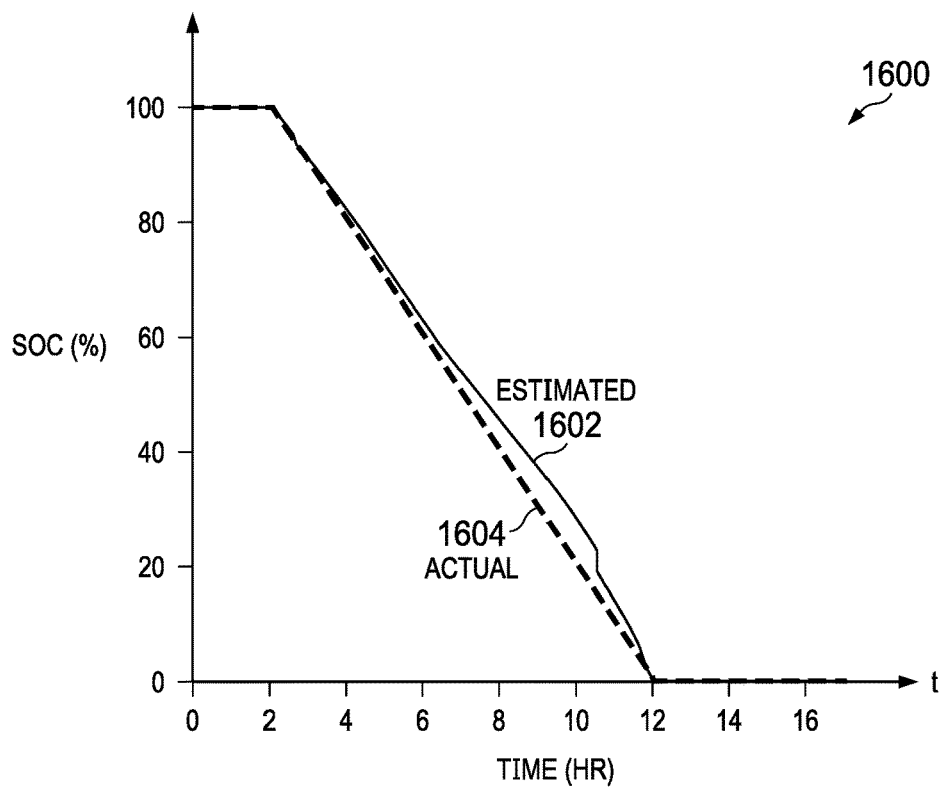
FIG. 16 is a graph of estimated and true remaining SOC for a battery discharge cycle of the cold battery no scale update.
Figure 17:
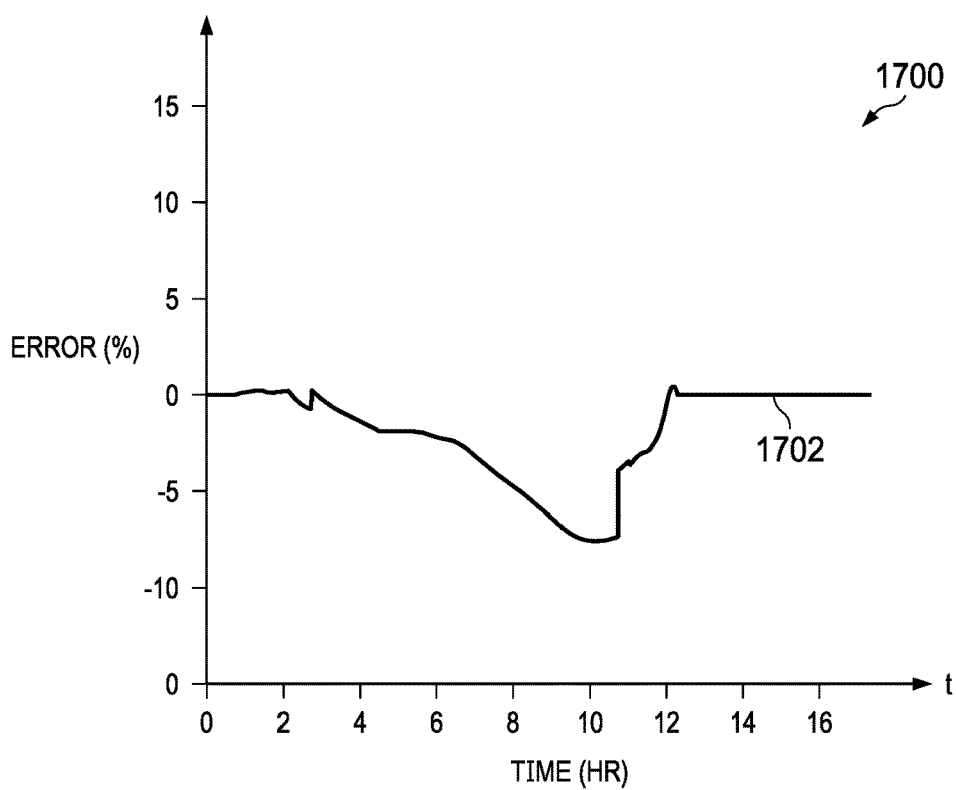
FIG. 17 is a graph of SOC error for the battery discharge cycle of FIG. 16.

FIGS. 12-17 illustrate simulated cold battery discharge performance of the system 100 for a 280 mA hour, 4.35 V associated battery 104. A graph 1200 in FIG. 12 shows an estimated remaining SOC curve 1202 and an actual remaining SOC curve 1204 for a first discharge cycle of the battery 104. A graph 1300 in FIG. 13 shows an SOC error curve 1302 for the first discharge cycle of the cold battery 104. Compared with the performance in FIGS. 6 and 7, the cold associated battery 104 in some cases exhibits a larger error in the estimated remaining state of charge compared with the battery 104 at room temperature. A graph 1400 in FIG. 14 includes an estimated remaining SOC curve 1402 and an actual remaining SOC curve 1404. FIG. 15 shows a graph 1500 with an SOC error curve 1502 for a second discharge cycle of the cold battery. FIG. 16 shows a graph that includes a curve 1602 that shows estimated remaining SOC and a curve 1604 that shows true remaining SOC for a battery discharge cycle of the cold battery with no scale update. A graph 1700 in FIG. 17 shows a curve 1702 of SOC error for the battery discharge cycle of FIG. 16. FIGS. 12-17 illustrate the improved performance of the controller IC 102 with successive battery discharge cycles for the cold battery, by progressively updating the scale factor 156.

Figure 18:
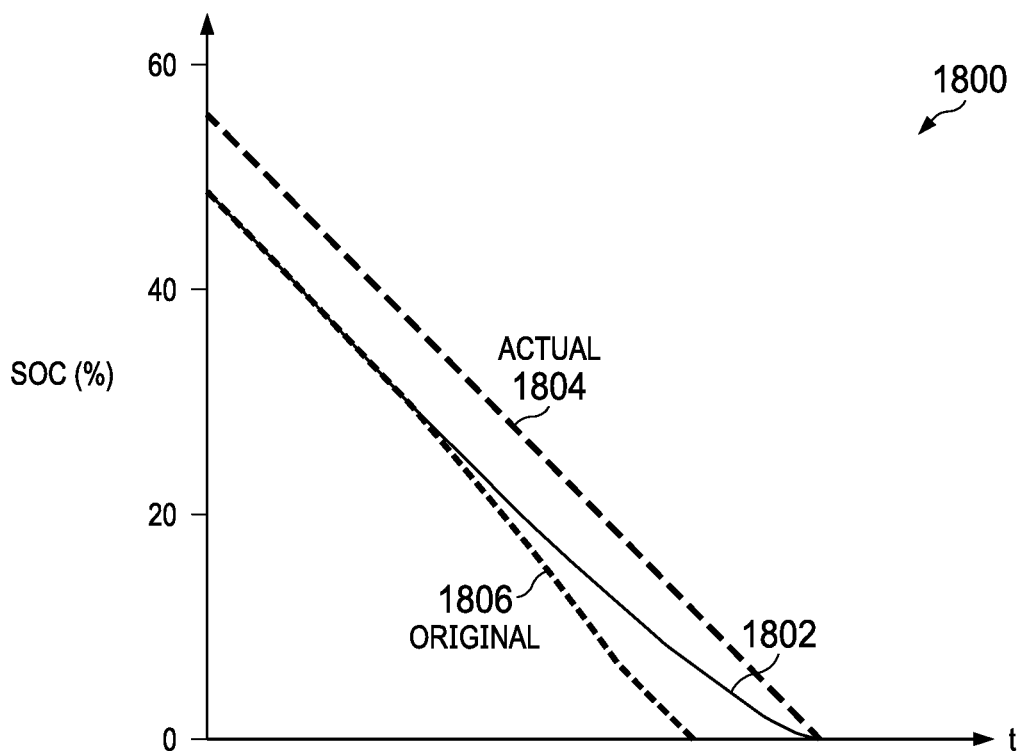
FIG. 18 is a graph of estimated and true SOC during discharge as a function of time, including a curve showing a convergent estimated SOC.

Referring also to FIG. 18, the processor 120 in certain examples computes the remaining capacity of the associated battery 104 at 216 according to the current rate 154 using an end of discharge convergence algorithm. In one example, the controller memory 122 is programmed with a default SOC equation 158, and also includes an alternate SOC equation 162 that implements an end of discharge conversion algorithm. FIG. 18 shows a graph 1800 that includes an estimated SOC curve 1602 resulting from the use of the alternate SOC equation 162 in order to provide end of discharge convergence. The graph 1800 also includes an actual SOC curve 1804, and a curve 1806 representing the estimated SOC computed using the default SOC equation 158. As shown in FIG. 18, the alternate SOC equation 162 ensures convergence of the SOC estimate with the final discharge value of the associated battery 104. In this example, the processor 120 implements the alternate SOC equation 162 in order to assure end-convergence of SOC capacity estimate 160 to zero at a termination voltage of the associated battery 104. In one example, the processor 120 provides voltage correlation using a scalable non-linear quadratic function or equation 162, shown below as equation (9):

$$SOC(k)=f(V\text{term},V(k),V(k-1),SOC(k-1)) \qquad (9)$$

where Vterm is the termination voltage of the battery 104. In one implementation, the processor 120 executes the program instructions 144 so as to begin use of the convergence algorithm or equation 162 close to a predetermined termination voltage, or to begin using the alternate equation 162 terminate voltage or if the estimated SOC capacity value 160 would otherwise jump to zero. The use of the alternate SOC equation 162 in certain examples facilitates smooth transition or approach of the estimated SOC value 160 toward zero, while avoiding overestimation at any point.

Figure 19:
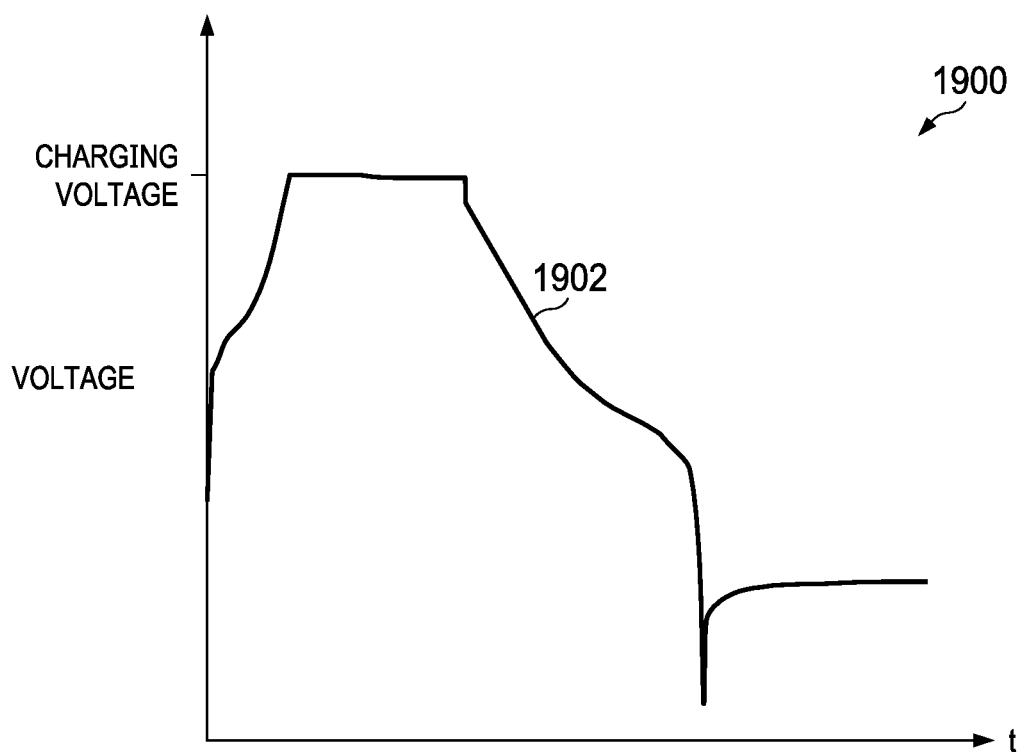
FIG. 19 is a graph of battery voltage through a charging and discharging cycle illustrating a maximum charging voltage.
Figure 20:
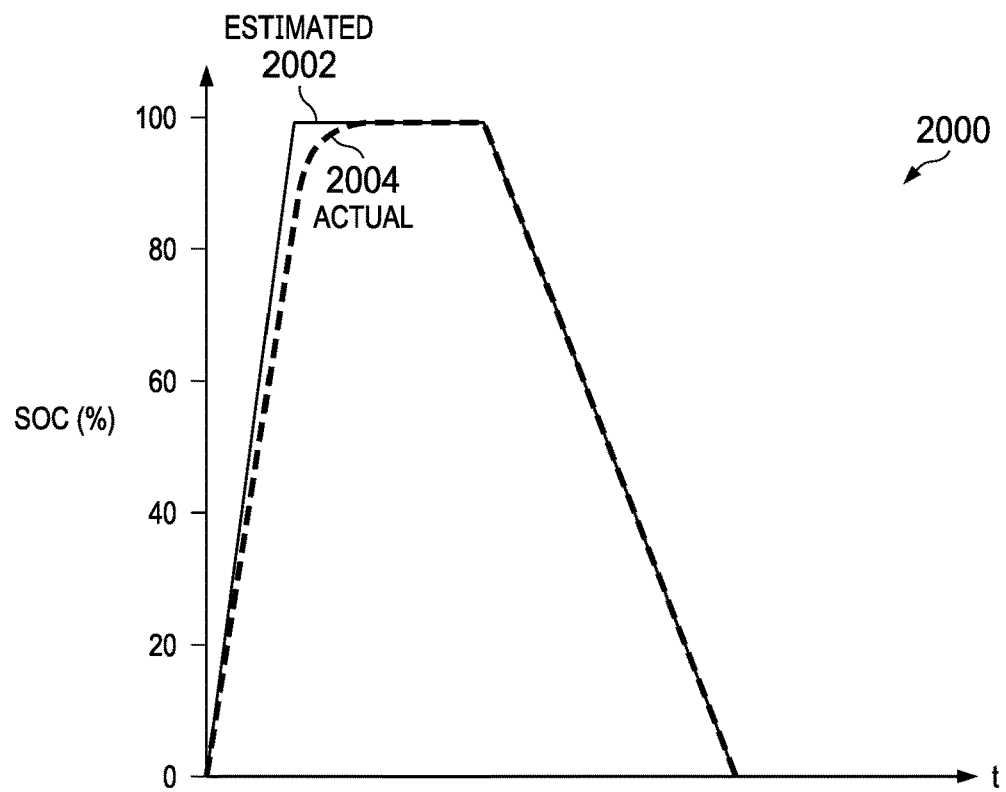
FIG. 20 is a graph of estimated and true remaining SOC for a charging and discharging cycle of a battery using a preset maximum charging voltage.

FIGS. 19-23 illustrate one example operation of the controller IC 102 in computing a maximum voltage using the component 164 of the memory 122 in order to provide automatic detection of the actual charging voltage of the associated battery 104. In this example, the processor 120 computes a maximum voltage value VMAX at 221 in FIG. 2 according to a charging voltage during charging of the associated battery 104. In addition, the processor 120 correlates a maximum remaining capacity value (e.g., 100% SOC or 0% DOD) to the maximum voltage value VMAX. FIG. 19 provides a graph 1900 that shows a battery voltage curve 1902 for a charging and discharging cycle. In particular, the associated battery 104 reaches a maximum charging voltage (VMAX) illustrated as the peak voltage of the curve 1902. FIGS. 19-23 illustrate simulation results for an associated battery 104 with a true charging voltage of 4400 mV, with the default the maximum voltage value in the memory 122 of 4200 vV. FIG. 20 shows a graph 2000 that includes an estimated SOC curve 2002 and an actual SOC curve 2004 for a charging and discharging cycle of the associated battery 104 using a preset maximum charging voltage. FIG. 20 shows that the estimated SOC (curve 2002) reaches 100% much earlier than the actual SOC (curve 2004).

Figure 21:
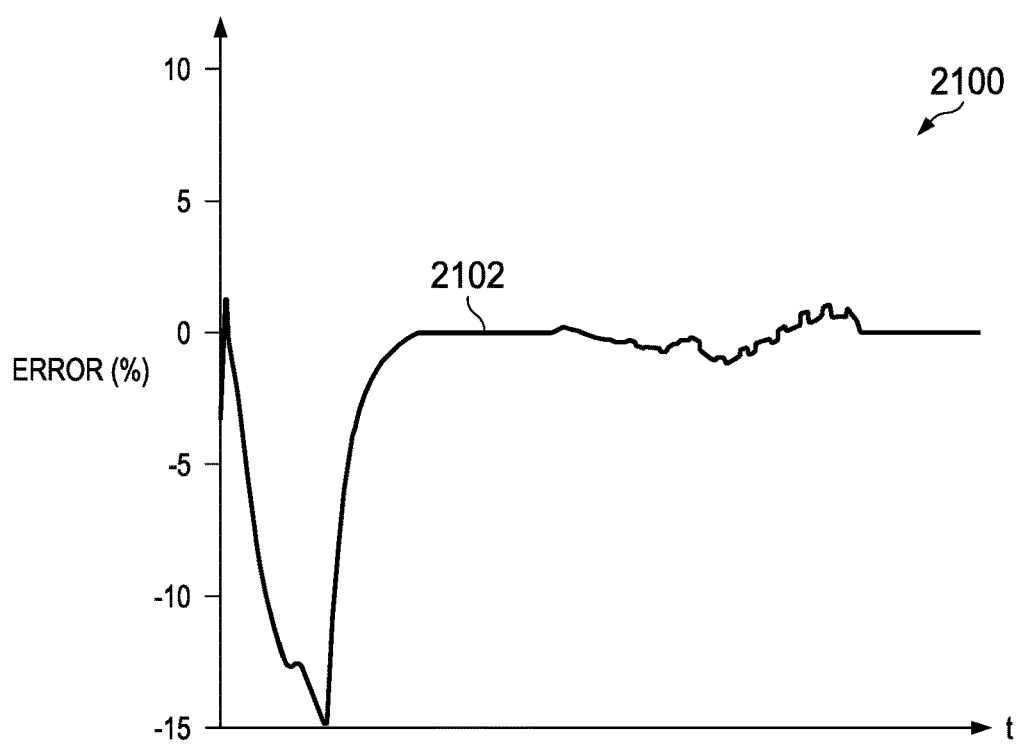
FIG. 21 is a graph of SOC error for the charging and discharging cycle of FIG. 20.
Figure 22:
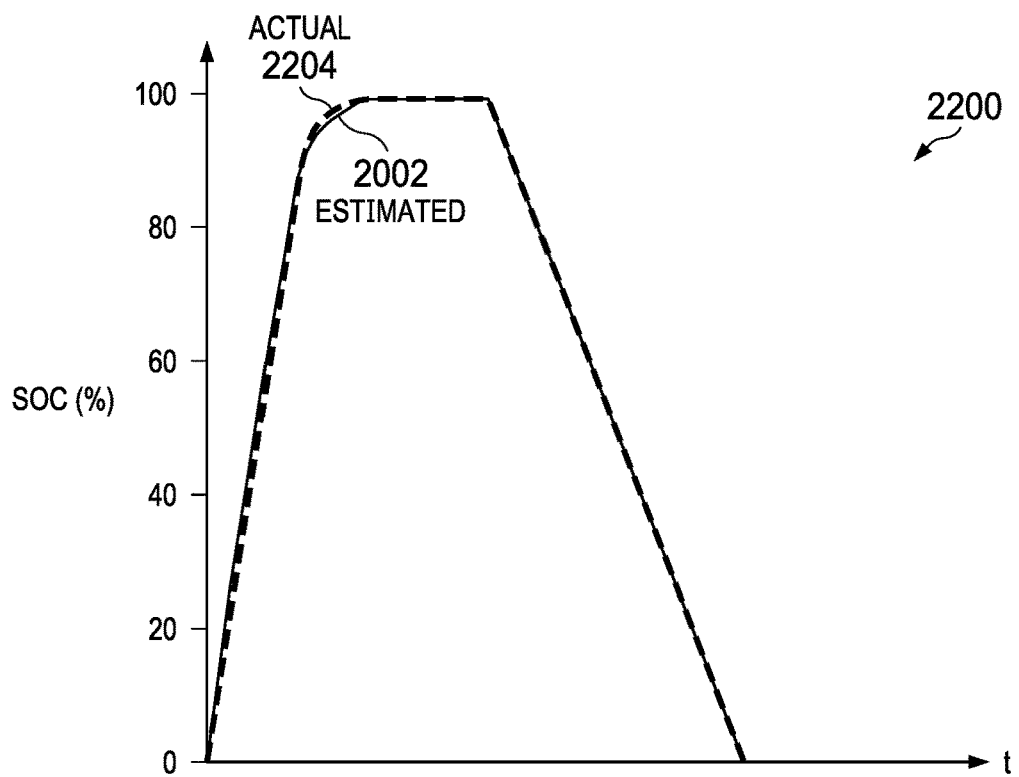
FIG. 22 is a graph of estimated and true remaining SOC for a charging and discharging cycle of a battery using a measured maximum charging voltage.
Figure 23:
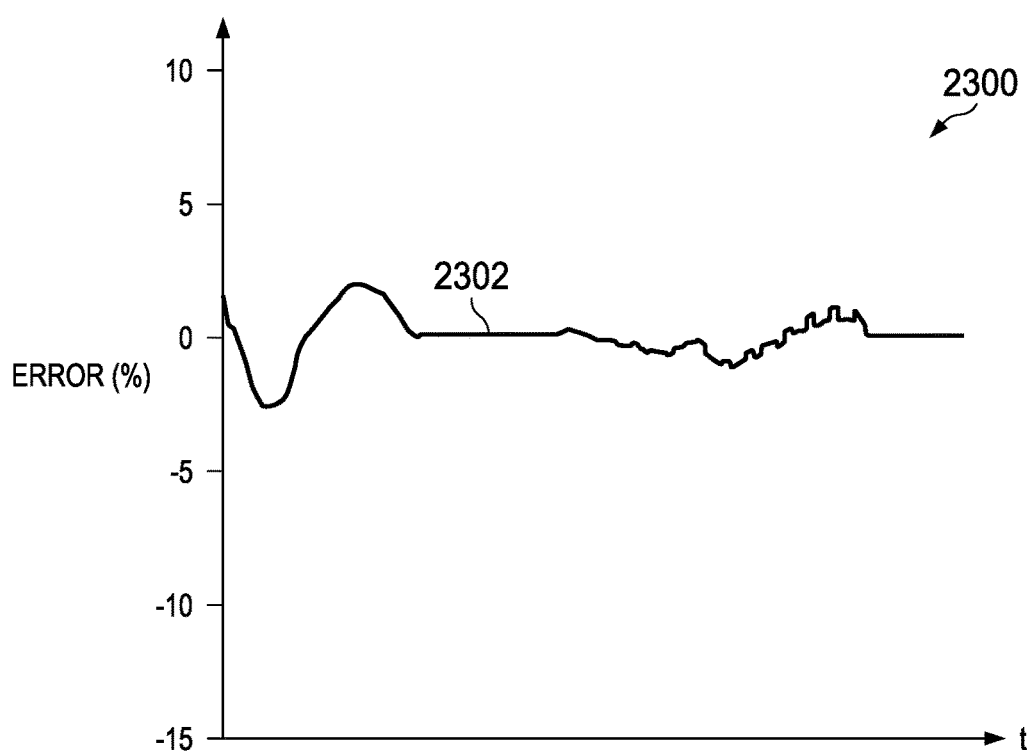
FIG. 23 is a graph of SOC error for the charging and discharging cycle of FIG. 22.

FIG. 21 shows a graph 2100 including a remaining SOC error curve 2102 for the charging and discharging cycle of FIG. 20 using the preset maximum charging voltage. In the example of FIGS. 20 and 21, the processor 120 uses a default maximum voltage in correlates the default voltage to 100% SOC (e.g., 0% DOD). In order to facilitate one time programming of the controller IC 102, while obtaining the benefits of no direct measurement of the battery current IBAT, FIGS. 22 and 23 illustrate operation of the example controller IC using the VMAX computation component 164. FIG. 22 shows a graph 2200 that includes an estimated SOC curve 2202, and an actual SOC curve 2204. FIG. 23 shows a graph 2300 that includes a remaining SOC error curve 2302 corresponding to the charge/discharge cycle illustrated in FIG. 22 using the VMAX computation component 164. The algorithm 164 in this example learns the maximum voltage (e.g., the new charging voltage (4400 mV)) from the previous charging cycle and hence 100% SOC is reached corresponding to the correct charging voltage thereby significantly reducing the error. Comparing the curves 2102 and 2302 of FIGS. 21 and 23, the use of the maximum voltage computation component 164 and the correlation of this measured current and voltage to the 100% SOC or 0% DOD value by the controller IC 102 significantly reduces the error in the estimated remaining battery capacity. In one example implementation, the controller IC 102 ensures that the maximum voltage of a battery will always correspond to the charging voltage when it is charged according to a constant current constant voltage (CC-CV) charging profile. The processor 120 in this example monitors the maximum battery voltage and saves the new maximum voltage as the charging voltage that corresponds to the 100% SOC. The processor 120 then uses the new charging voltage as the 100% SOC point for the next charging cycle.

Modifications are possible in the described embodiments, and other embodiments are possible, within the scope of the claims.

The following is claimed:

1. A controller for use in a battery management system having a battery, the controller comprising:
    a memory storing a set of instructions; and
    a processor, upon retrieving and implementing the instructions stored in the memory, configured to:
        estimate a current rate, when the battery is in a steady state mode, according to: a first battery voltage sample that represents a battery voltage of the battery at a first sample time, a second battery voltage sample that represents the battery voltage at a second sample time, a temperature sample that represents a temperature of the battery at the first sample time, and a steady state model of the battery;
        estimate a scale factor, when the battery is in the steady state mode, the scale factor representing a deviation in a normalized resistance of the battery according to the first battery voltage sample;
        estimate the current rate, when the battery is in a dynamic mode, according to: a voltage value, the temperature sample, the scale factor, and a dynamic model of the battery; and
        estimate a remaining capacity of the battery according to the current rate.

2. The controller of claim 1:
    wherein the memory stores a lookup table that represents an open circuit voltage and a resistance of a particular battery type; and
    wherein the processor is further configured, upon retrieving and implementing the instructions stored in the memory, when the battery is operating in the steady state mode, to:
        determine an open circuit voltage value and a resistance value of the battery by linear interpolation of the lookup table according to: the temperature sample, and a depth of discharge of the battery;
        estimate the current rate according to: voltage values computed by linear regression, the open circuit voltage value, and the resistance value of the battery; and
        estimate the scale factor according to: one of the voltage values computed by linear regression, the open circuit voltage value, and the resistance value of the battery.

3. The controller of claim 1,
    wherein the memory stores dynamic model parameters that represent a particular battery type; and
    wherein the processor is further configured, upon retrieving and implementing the instructions stored in the memory, when the battery is operating in the dynamic mode, to:
        estimate the current rate according to: an instantaneous battery voltage sample, the temperature sample, the scale factor, and the dynamic model parameters.

4. The controller of claim 1, wherein the processor is further configured, upon retrieving and implementing the instructions stored in the memory, to estimate the remaining capacity of the battery according to the current rate using an end of discharge convergence algorithm.

5. The controller of claim 1, wherein the processor is further configured, upon retrieving and implementing the instructions stored in the memory, to estimate the remaining capacity of the battery as a present depth of discharge (DOD) value for the battery according to a previous DOD value and the current rate.

6. The controller of claim 1, wherein the processor is further configured, upon retrieving and implementing the instructions stored in the memory, to:
    estimate the current rate, when the battery is in the steady state mode, according to: battery voltage values that are obtained by fitting successive voltage samples to a straight line using piecewise linear regression, the temperature sample, and the steady state model; and
    estimate the current rate, when the battery is in the dynamic mode, according to: an instantaneous battery voltage, the temperature sample, the scale factor, and a dynamic model of the battery.

7. The controller of claim 1, wherein the processor is further configured to, upon retrieving and implementing the instructions stored in the memory, estimate the remaining capacity of the battery according to the current rate using an end of discharge convergence algorithm.

8. The controller of claim 7, wherein the processor is further configured, upon retrieving and implementing the instructions stored in the memory, to: estimate a maximum voltage value according to a charging voltage during charging of the battery, and correlate a maximum remaining capacity value to the maximum voltage value.

9. The controller of claim 1, wherein the processor is further configured, upon retrieving and implementing the instructions stored in the memory, to:
determine whether the battery is operating in the steady state mode or the dynamic mode according to changes in the current rate obtained by tracking an average change in voltage.

10. The controller of claim 9, wherein the processor is further configured, upon retrieving and implementing the instructions stored in the memory, to:
determine that the battery is operating in the dynamic mode in response to detecting a change in the current rate; and
determine that the battery is operating in the steady state mode in response to detecting no change in the current rate for a non-zero time.

11. The controller of claim 9, wherein the processor is further configured, upon retrieving and implementing the instructions stored in the memory, to estimate the remaining capacity of the battery according to the current rate using an end of discharge convergence algorithm.

12. The controller of claim 9:
wherein the memory stores a lookup table that represents an open circuit voltage and a resistance of a particular battery type; and
wherein the processor is further configured, upon retrieving and implementing the instructions stored in the memory, when the battery is operating in the steady state mode, to:
determine an open circuit voltage value and a resistance value of the battery by linear interpolation of the lookup table according to: the temperature sample, and a depth of discharge of the battery;
estimate the current rate according to: voltage values computed by linear regression, the open circuit voltage value, and the resistance value of the battery; and
estimate the scale factor according to: one of the voltage values computed by linear regression, the open circuit voltage value, and the resistance value of the battery.

13. The controller of claim 12,
wherein the memory stores dynamic model parameters that represent the particular battery type; and
wherein the processor is further configured, upon retrieving and implementing the instructions stored in the memory, when the battery is operating in the dynamic mode, to:
estimate the current rate according to: an instantaneous battery voltage sample, the temperature sample, the scale factor, and the dynamic model parameters.

14. The controller of claim 13, wherein the processor is further configured, upon retrieving and implementing the instructions stored in the memory, to estimate the remaining capacity of the battery according to the current rate using an end of discharge convergence algorithm.

15. The controller of claim 13, wherein the processor is further configured, upon retrieving and implementing the instructions stored in the memory, to estimate a maximum voltage value according to a charging voltage during charging of the battery, and to correlate a maximum remaining capacity value to the maximum voltage value.

16. A method of managing a battery, the method comprising:
when a battery is operating in a steady state mode, estimating, by a controller, a current rate according to a first battery voltage sample that represents a battery voltage of the battery at a first sample time, a second battery voltage sample that represents the battery voltage at a second sample time, a temperature sample that represents a temperature of the battery at the first sample time, and a steady state model of the battery;
in response to determining, by the controller, that the battery is operating in the steady state mode, estimating, by the controller, a scale factor that represents a deviation in a normalized resistance of the battery according to the first battery voltage sample;
in response to determining, by the controller, that the battery is operating in a dynamic mode, estimating, by the controller, the current rate according to the first battery voltage sample, the temperature sample, the scale factor, and a dynamic model of the battery; and
estimating, by the controller, a remaining capacity of the battery according to the current rate.

17. The method of claim 16, further comprising:
determining, by the controller, that the battery is operating in the dynamic mode in response to detecting a change in the current rate; and
determining, by the controller, that the battery is operating in the steady state mode in response to detecting no change in the current rate for a non-zero time.

18. The method of claim 16, further comprising, when the battery is operating in the steady state mode:
determining, by the controller, an open circuit voltage value and a resistance value of the battery by linear interpolation of a lookup table according to: the temperature sample, and a depth of discharge of the battery;
estimating, by the controller, the current rate according to: voltage values computed by piecewise linear regression, the open circuit voltage value, and the resistance value of the battery; and
estimating, by the controller, the scale factor according to: one of the voltage values computed by linear regression., the open circuit voltage value, and the resistance value of the battery.

19. The method of claim 18, further comprising, when the battery is operating in the dynamic mode:
estimating, by the controller, the current rate according to: an instantaneous battery voltage sample, the temperature sample, the scale factor, and dynamic model parameters.

20. The method of claim 16, further comprising, when the battery is operating in the dynamic mode:
estimating, by the controller, the current rate according to: an instantaneous battery voltage sample, the temperature sample, the scale factor, and dynamic model parameters.

21. The method of claim 16, further comprising:
estimating, by the controller, the current rate, when the battery is in the steady state mode, according to: battery voltage values that are obtained by fitting successive voltage samples to a straight line using piecewise linear regression, the temperature sample, and the steady state model; and
estimating, by the controller, the current rate, when the battery is in the dynamic mode, according to: an instantaneous battery voltage, the temperature sample, the scale factor, and the dynamic model of the battery.

22. A battery management system, comprising:
a battery; and
a controller, comprising:
a memory storing a set of instructions; and
a processor, upon retrieving and implementing the instructions stored in the memory, configured to:

estimate a current rate, when the battery is in a steady state mode, according to: a first battery voltage sample that represents a battery voltage of the battery at a first sample time, a second battery voltage sample that represent the battery voltage at a second sample time, a temperature sample that represents a temperature of the battery at the first sample time, and a steady state model of the battery;

estimate a scale factor, when the battery is in the steady state mode, the scale factor representing a deviation in a normalized resistance of the battery according to the first battery voltage sample;

estimate the current rate, when the battery is in a dynamic mode, according to: the first battery voltage sample, the temperature sample, the scale factor, and a dynamic model of the battery; and estimate a remaining capacity of the battery according to the current rate.

23. The controller of claim 22, wherein the processor is further configured, upon retrieving and implementing the instructions stored in the memory, to:

estimate the current rate, when the battery is in the steady state mode, according to: battery voltage values that are obtained by fitting successive voltage samples to a straight line using piecewise linear regression, the temperature sample, and the steady state model; and estimate the current rate, when the battery is in the dynamic mode, according to: an instantaneous battery voltage, the temperature sample, the scale factor, and the dynamic model of the battery.

\* \* \* \* \*